(12) United States Patent
Borthakur et al.

(10) Patent No.: US 10,312,279 B2
(45) Date of Patent: Jun. 4, 2019

(54) HIGH DYNAMIC RANGE PIXEL WITH IN-PIXEL LIGHT SHIELD STRUCTURES

(71) Applicant: SEMICONDUCTOR COMPONENTS INDUSTRIES, LLC, Phoenix, AZ (US)

(72) Inventors: Swarnal Borthakur, Boise, ID (US); Marc Allen Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/799,833

(22) Filed: Oct. 31, 2017

(65) Prior Publication Data
US 2019/0131333 A1    May 2, 2019

(51) Int. Cl.
*H01L 31/062*    (2012.01)
*H01L 27/146*    (2006.01)

(52) U.S. Cl.
CPC .. *H01L 27/14623* (2013.01); *H01L 27/14607* (2013.01); *H01L 27/14621* (2013.01); *H01L 27/14627* (2013.01); *H01L 27/14645* (2013.01); *H01L 27/14685* (2013.01)

(58) Field of Classification Search
CPC ......... H01L 27/14607; H01L 27/14621; H01L 27/14627
USPC .......................... 257/290, 291, 292, 293, 294
See application file for complete search history.

(56) References Cited

U.S. PATENT DOCUMENTS

| | | | |
|---|---|---|---|
| 4,936,190 A | 6/1990 | Pilcher | |
| 6,627,305 B1 * | 9/2003 | Deane | G02F 1/1333 257/E31.041 |
| 6,750,523 B2 | 6/2004 | Blanchard | |
| 7,169,633 B2 * | 1/2007 | Huang | H01L 27/14621 438/57 |
| 7,208,742 B1 | 4/2007 | Zelakiewicz et al. | |
| 8,792,029 B2 | 7/2014 | Lee | |
| 9,338,413 B2 * | 5/2016 | Keelan | H01L 27/14621 |
| 9,989,640 B2 * | 6/2018 | Hsu | G01S 17/026 |
| 2006/0221218 A1 | 10/2006 | Adler et al. | |
| 2011/0057282 A1 | 3/2011 | Ellis-Monaghan et al. | |
| 2014/0210028 A1 | 7/2014 | Chen et al. | |

* cited by examiner

*Primary Examiner* — Tan N Tran
(74) *Attorney, Agent, or Firm* — Treyz Law Group, P.C.; Joseph F. Guihan

(57) ABSTRACT

Multi-photodiode image pixels may include sub-pixels with differing light sensitivities. Microlenses may be formed over the multi-photodiode image pixels so that light sensitivity of sub-pixels in an outer group of sub-pixels is enhanced. To prevent high angle light incident upon one of the sub-pixels of the image pixel from generating charges in a photosensitive region of another sub-pixel of the image pixel, intra-pixel isolation structures may be formed. Intra-pixel isolation structures may surround, and in some embodiments, overlap the light collecting region of an inner photodiode. When the intra-pixel isolation structures have a different index of refraction than light filtering material formed adjacent to the isolation structures, high angle light incident upon the isolation structures may be reflected back into the sub-pixel it was initially incident upon. Intra-pixel isolation structures may be formed entirely from optically transparent materials or a combination of optically transparent and opaque materials.

16 Claims, 17 Drawing Sheets

HIGH DYNAMIC RANGE PIXEL WITH IN-PIXEL LIGHT SHIELD STRUCTURES

BACKGROUND

This relates generally to imaging sensors, and more particularly, to imaging sensors with pixels that include more than one photosensitive region.

Modern electronic devices such as cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical charges. Conventional image pixel arrays include frontside illuminated image pixels or backside illuminated image pixels. Image pixels are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A single image sensing pixel in the two-dimensional array of image sensing pixels includes a single photosensitive region, a color filter formed over the photosensitive region, and a single dome-shaped micro-lens formed over the color filter. Certain image sensing pixels may include two or more photosensitive regions.

When viewed as a whole, the array of color filters associated with the array of image sensing pixels in the image sensor is referred to as a color filter array. Many imagers use a Bayer color filter array in which vertically and horizontally adjacent color filters in the array are of different colors. The Bayer color filter array includes red, green, and blue color filters. Ideally, photosensitive regions associated with a pixel having a red color filter would only be exposed to light that has passed through a red color filter, photosensitive regions associated with a pixel having a green color filter would only be exposed to light that has passed through a green color filter, and photosensitive regions associated with a pixel having a blue color filter would only be exposed to light that has passed through a blue color filter.

In embodiments where multiple photosensitive regions are formed in a single image sensing pixel, there may be undesired optical cross-talk between photosensitive regions within a single image sensing pixel. In many imagers, the photosensitive regions of any single given image sensing pixel are associated with a single color (i.e., a single color filter is formed over the single given image sensing pixel). Additionally, there is often undesired optical cross-talk between adjacent image sensing pixels associated with different colors (i.e., image sensing pixels having color filters of different colors). Undesired optical cross-talk within a single given image sensing pixel is characterized by light passing through a portion of a color filter formed over a first photosensitive region in a single given image sensing pixel and impeding (and consequently generating charge) in a second photosensitive region in the single given image sensing pixel. Undesired optical cross-talk between pixels is characterized by light passing through a color filter of one color and impeding on a photosensitive region of a pixel associated with a different color. An example of undesired optical cross-talk is when light that has passed through a red color filter impedes on a photosensitive region associated with a green pixel (i.e., a pixel having a green color filter). Optical cross-talk (both between pixels and within a pixel having multiple photosensitive regions) is often caused by high incident angle light and flare conditions, and can degrade the output image quality of an imager.

It would therefore be desirable to be able to provide improved image pixels for imaging devices.

DETAILED DESCRIPTION

Figure 1:
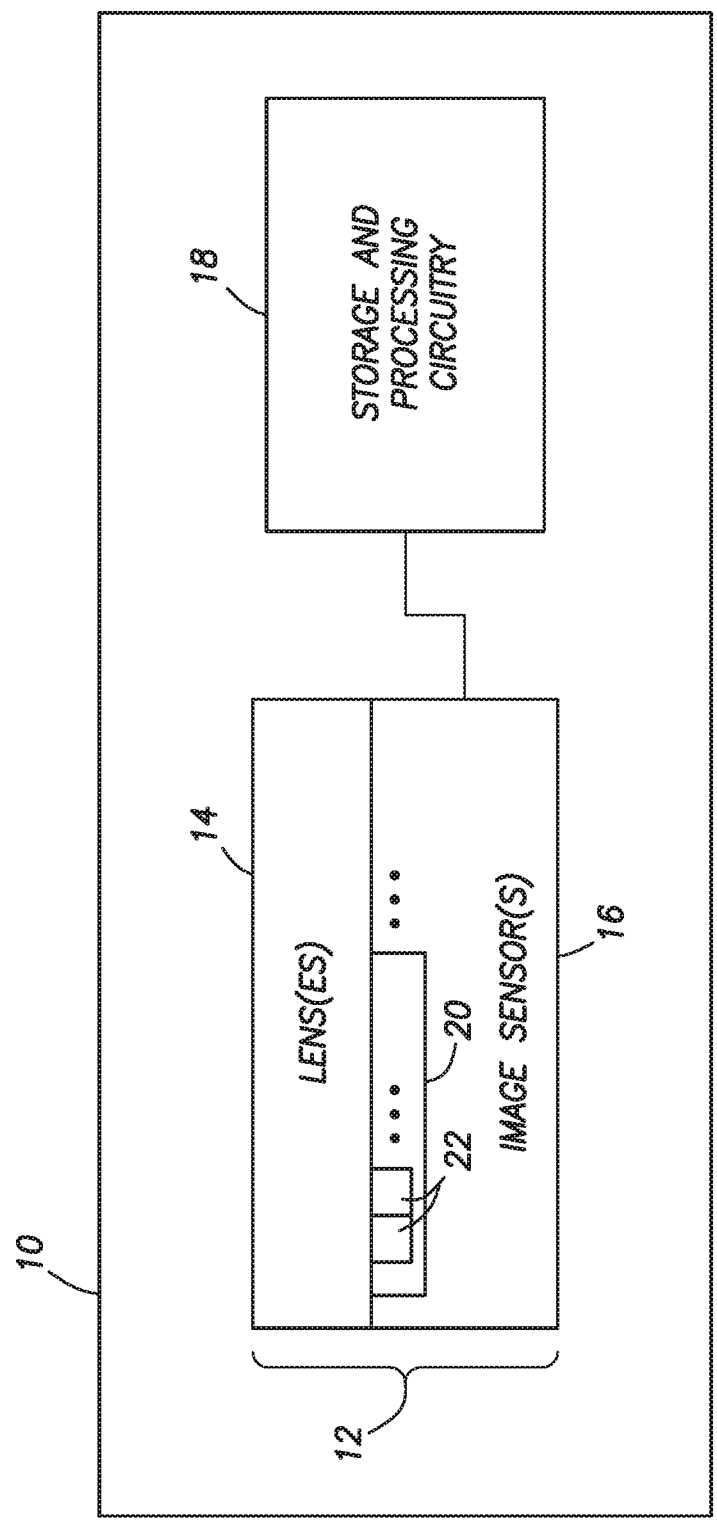
FIG. 1 is a diagram of an illustrative electronic device in accordance with an embodiment.

Embodiments of the present invention relate to image sensors, and more particularly, to image sensors having pixels that each contain multiple sub-pixel structures. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of image pixels. The image pixels in the image sensors may include photosensitive elements such as photodiodes that convert the incoming light into electric charge. The electric charges may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Image sensors may be provided with one or more arrays of multi-photodiode image pixels (sometimes referred to herein as toroid photodiode pixels, toroid image pixels, toroid pixels, nested sub-pixels, super-pixels, image pixels, or pixels). Informally, toroid pixels may be referred to as donut pixels. Multi-photodiode image pixels may include photosensitive elements formed in a substrate and that are adjacent to one another. Each multi-photodiode image pixel may have two, three, five, nine, or any other suitable number of photodiodes. In the context of multi-photodiode image pixels, a single photodiode within the multi-photodiode image pixel may refer to a contiguous light collecting area formed in a semiconductor substrate. Charges from a single photodiode may be individually read out. Alternatively, charges accumulated in different photodiodes within the multi-photodiode may be read out in a combined fashion (i.e., accumulated charges from a first photodiode and accumulated charges from a second photodiode may be read out simultaneously to a common charge storage node in the pixel circuit).

The multiple photodiodes in each toroid pixel may be grouped into an outer sub-pixel group and an inner sub-pixel group. It may be desirable for the outer sub-pixel group of a toroid pixel to be more sensitive to incident light than the inner sub-pixel group. The increased light sensitivity of the outer sub-pixel group of a toroid pixel may be a function of the increased light collection area of the outer sub-pixel group (relative to the light collection area of the inner sub-pixel group). The outer sub-pixel group may also have a higher light sensitivity due to having one or more microlenses formed over the outer sub-pixel group that steers light away from the inner sub-pixel group and that steers light toward the outer sub-pixel group. The microlenses that increase the light sensitivity of the outer sub-pixel groups in an array of nested sub-pixels may be circular microlenses, or may be toroidal microlenses. Circular microlenses may, when viewed from above, have a circular shape, while toroidal microlenses may, when viewed from above, have a toroidal or donut shape. The microlenses may be formed such that they partially overlap the light collecting area of the inner sub-pixel group, or they may be formed exclusively over the light collecting area of the outer sub-pixel group (i.e., with no overlap with the inner sub-pixel group).

Any given sub-pixel may be coupled to pixel circuitry that is shared with other sub-pixels in the toroid pixel or nested sub-pixels. The outer sub-pixel group may include one, two, four, eight, or any other suitable number of sub-pixels. Each of the sub-pixels in the outer sub-pixel group may be associated with a single photodiode. The inner sub-pixel group may include one or more sub-pixels. One or more microlenses or other light guiding structures may be formed over the multi-sub-pixel image pixel to direct light to the photodiode(s) in the outer sub-pixel group. Each of the sub-pixels in the inner sub-pixel group may be associated with a single photodiode.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may, for example, be a backside illumination image sensor. If desired, camera module 12 may be provided with an array of lenses 14 and an array of corresponding image sensors 16.

Control circuitry such as storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices. Image pixels 22 may be frontside illumination (FSI) image pixels or backside illumination (BSI) image pixels. Image pixels 22 may include one or more sub-pixels. Each sub-pixel in an image pixel 22 may have a photodiode or photodiode region and readout circuitry for the photodiode or photodiode region. Readout circuitry associated with each photodiode or photodiode region in a given sub-pixel may include transfer gates, floating diffusion regions, and reset gates. Isolation regions between sub-pixels may also be considered part of either or both of the sub-pixels between which the isolation structure is formed.

Figure 2A:
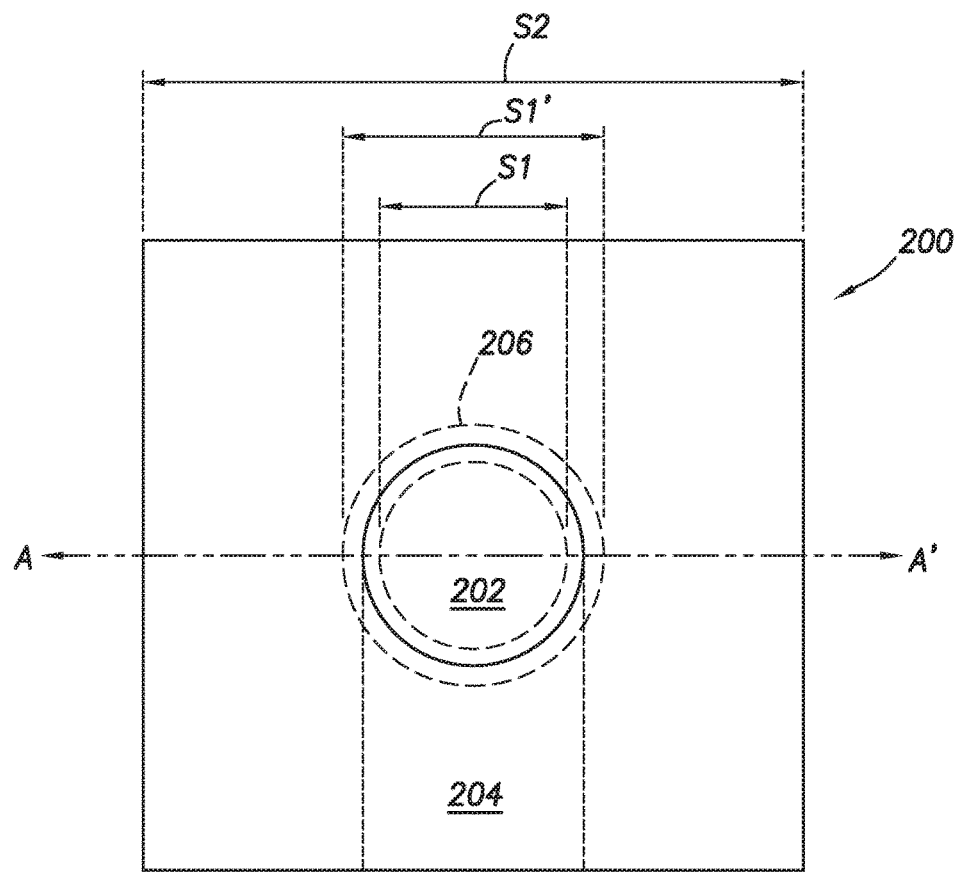
FIG. 2A is a surface view of nested sub-pixels with an inner sub-pixel having a circular light collecting surface in accordance with an embodiment.

FIG. 2A is a surface view of nested sub-pixels 200 in a pixel 22 of array 20. Nested sub-pixels 200 may be an alternate embodiment to the nested sub-pixels of FIGS. 3-6 and 9. The surface view of the nested sub-pixels 200 of FIG.

2A may be referred to as a diagram of the light collecting areas (LCAs) of the nested sub-pixels 200. Nested sub-pixels 200 may correspond to photodiodes with associated pixel circuitry used to capture the same spectrum of light. As an example, the nested sub-pixels 200 may be used to capture red, green, blue, cyan, magenta, yellow, near-infrared, infrared, or any other spectrum of light. A single red, green, blue, cyan, magenta, yellow, near-infrared, infrared, or clear color filter may be formed over the nested sub-pixels 200. In certain embodiments, the color filter formed over nested sub-pixels 200 may have areas that pass colored light and areas that are clear (i.e., that pass visible or full-spectrum light outside the visible spectrum).

Nested sub-pixels 200 shown in FIG. 2A may be included in a subset of the pixels 22 of array 20, or in all of the pixels 22 of array 20. The nested sub-pixels 200 of FIG. 2A may include a first sub-pixel 202, which may be referred to as the inner sub-pixel 202. Inner sub-pixel 202 may be completely surrounded by a second sub-pixel 204, which may be referred to as the outer sub-pixel 204. Inner sub-pixel 202 and outer sub-pixel 204 may correspond to n-type doped photodiode regions in a semiconductor substrate and respective sub-pixel circuitry in the substrate such as transfer gates, floating diffusion regions, and reset gates of the nested sub-pixels 200 that is coupled to the photodiode regions in the sub-pixels 202 and 204. The semiconductor substrate (not shown) may be a bulk p-type substrate made of silicon, or any other suitable semiconductor material.

A photodiode in inner sub-pixel 202 may have a circular shape at the surface. In other words, the light collecting area of inner sub-pixel 202 is a circular region. At the surface, the inner sub-pixel 202 may have a diameter S1. As an example, the diameter S1 of a photodiode in inner sub-pixel 202 may be 1 micron, but may alternatively be any other dimension without departing from the scope of the present embodiment. In some embodiments, the width of a circular or polygonal photodiode in the inner sub-pixel 202 may have a dimension that is smaller than S1 (i.e., the photodiode may be formed in a portion of the inner sub-pixel 202). Outer sub-pixel 204 may have a square outer boundary and a circular inner boundary at the surface. The area enclosed by the square outer boundary and circular inner boundary of outer sub-pixel 204 shown in FIG. 2A may correspond to the light collecting area of outer sub-pixel 204. The circular inner boundary of outer sub-pixel 204 at the surface may be similar in shape but larger in size to the outer boundary of the inner sub-pixel 202 (i.e., the circular inner boundary of outer sub-pixel 204 has a diameter S1' that is greater than the diameter S1). As shown in FIG. 2, the length of one of the sides of outer sub-pixel 204 is S2. As an example, S2 may be 3 microns, but may alternatively be any other dimension without departing from the scope of the present embodiment. The length S2 is preferably greater than the length S1. Outer sub-pixel 204 is illustrated in FIG. 2A as having a square outer boundary but may alternatively have a rectangular outer boundary. As may be the case with the photodiode(s) in inner sub-pixel 202, the photodiode(s) in the outer sub-pixel 204 may have a dimension that is less than S2 (i.e., the photodiode(s) may formed in a portion of the outer sub-pixel 204).

In between the inner sub-pixel 202 and the outer sub-pixel 204, an isolation region 206 may be formed. The isolation region 206 may be devoid of any circuitry related to the pixel 22 or its sub-pixels 202 and 204. Isolation region 206 may separate individual sub-pixels in a given sub-pixel group from one another, and may also separate individual sub-pixels in different respective sub-pixel groups from one another. Isolation region 206 may include different types of isolation devices such as trench isolation structures, doped semiconductor regions, metallic barrier structures, or any other suitable isolation device. Charges generated within the semiconductor substrates of the photodiodes in the inner sub-pixel 202 and the outer sub-pixel 204 in response to incident light 210 at the surface of the nested sub-pixels 200 may be prevented from mixing with each other due to electrical cross-talk by virtue of the isolation devices/structures in the region 206.

The inner sub-pixel 202 may have a lower sensitivity to incident light, and may be referred to as having a lower sensitivity light collecting area compared to outer sub-pixel 204. The respective doping concentrations of photodiodes in inner sub-pixel 202 and outer sub-pixel 204 may be different or they may be the same. As an example, the doping concentrations of photodiode regions in inner sub-pixel 202 may be modified to reduce the sensitivity of inner sub-pixel 202 to light. However, for the sake of simplicity in explaining and highlighting the properties of the nested sub-pixels 200, it will be assumed that the sub-pixels 202 and 204 have photodiodes with the same doping concentrations. The lower sensitivity to incident light of inner sub-pixel 202 compared to outer sub-pixel 204 may be a result of the lower light collecting area of a photodiode within inner sub-pixel 202 compared to the light collecting area of photodiode(s) within outer sub-pixel 204.

One or more microlenses (not shown in FIG. 2A) may be formed over the nested sub-pixels 200 of FIG. 2A to direct light toward the outer sub-pixel 204. The one or more microlenses may be formed over the color filter formed over nested sub-pixels 200 (not shown in FIG. 2A). To direct light toward outer sub-pixel 204, the one or more microlenses may be formed over only outer sub-pixel 204. In some embodiments however, the one or more microlenses that direct light toward outer sub-pixel 204 may partially overlap the light collecting area of sub-pixel 202. Directing light toward outer sub-pixel 204 (and thereby, away from the inner sub-pixel 202) may further increase the sensitivity of the light collecting area of outer sub-pixel 204, relative to the sensitivity of the light collecting area of inner sub-pixel 202. In other words, because a larger amount of light incident on nested sub-pixels 200 is directed to outer sub-pixel 204 than to inner sub-pixel 202, inner sub-pixel 202 is said to have a lower sensitivity light collecting area compared to outer sub-pixel 204.

Figure 2B:
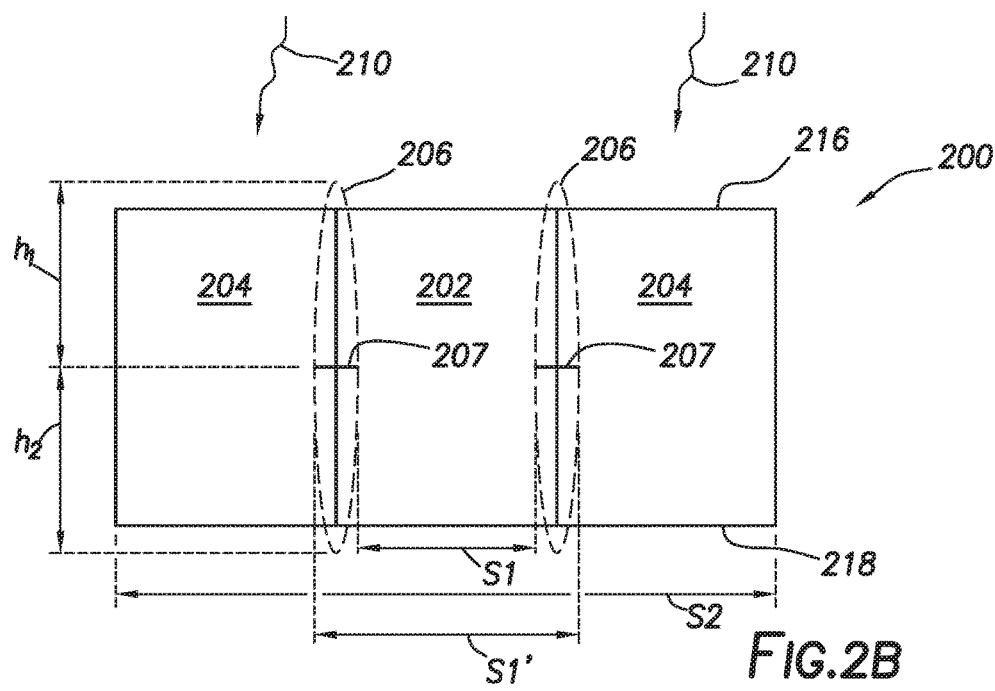
FIG. 2B is a cross-sectional side view of nested sub-pixels along the A-A' line in FIG. 2A, in accordance with an embodiment.

FIG. 2B is a cross-sectional side view of nested sub-pixels 200 along the A-A' line in FIG. 2A. FIG. 2B illustrates an isolation region 206 between inner sub-pixel 202 and outer sub-pixel 204. Isolation region 206 may be perpendicular to the surface of nested sub-pixels 200. During a light collecting interval, light 210 incident on nested sub-pixels 200 may be absorbed by inner sub-pixels 202 and outer sub-pixels 204. As described above in connection with FIG. 2A, the outer sub-pixel 204 has a more sensitive light collecting area compared to inner sub-pixel 202 due to at least the larger size of outer sub-pixel 204 and the one or more microlenses formed on nested sub-pixels 200 to direct charge to outer sub-pixel 204. As a result of outer sub-pixel 204 having a more sensitive light collecting area, the number of photo-generated charges in outer sub-pixel 204 after exposure to incident light 210 may be larger than the number of photo-generated charges in inner sub-pixel 202 after exposure to the incident light 210.

Figure 3:
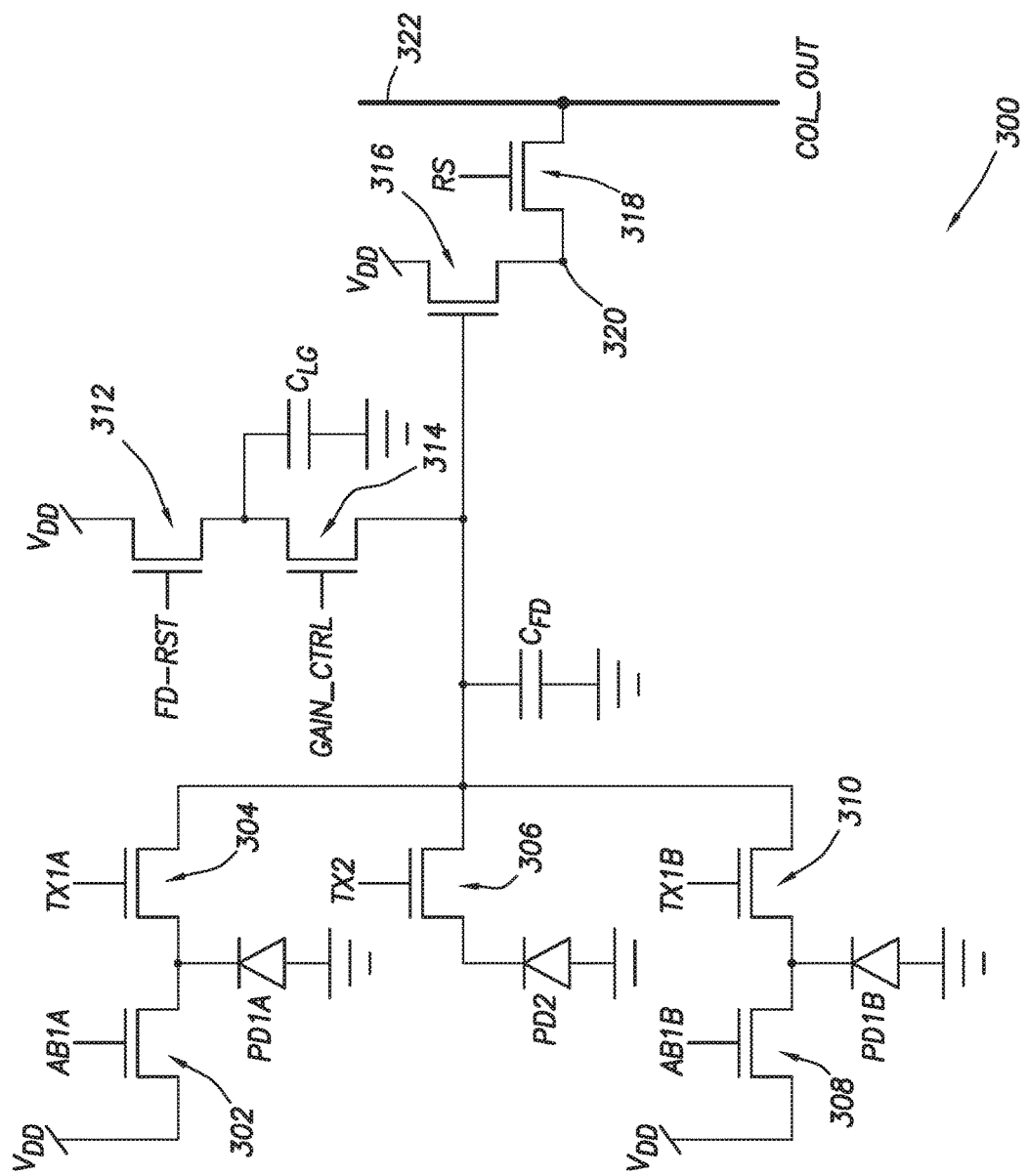
FIG. 3 is a schematic view of a pixel circuit for an image sensing pixel with multiple light sensitive regions in accordance with an embodiment.

Additionally, due to the greater substrate volume associated with the outer sub-pixel 204, the photodiode(s) in outer sub-pixel 204 may have a higher charge storage capacity than the photodiode in the inner sub-pixel 202. The higher charge storage capacity and higher light sensitivity of the outer sub-pixel 204 may enable nested sub-pixel 200 to have a high dynamic range. The high dynamic range may be achieved through the implementation of a pixel circuit as shown in FIG. 3.

Photogenerated charges in outer sub-pixel 204 may undesirably leak or diffuse across isolation region 206 and into inner sub-pixel 202, despite the presence of isolation devices/structures formed in the isolation region 206. Isolation region 206 may have first and second regions separated by a boundary 207. Isolation devices used in the isolation region 206 may include isolation structures of various types, such as trench isolation structures, doped semiconductor regions, and metallic barriers, which may be formed in one or both of the first and second regions of isolation region 206. When the same type of isolation device is formed in both the first and second regions of isolation region 206 (i.e., when a single isolation device type is formed in isolation region 206) the isolation device in region 206 may be continuous. When the type of isolation device in a first region of isolation region 206 having a height h1 is different from the type of isolation device in a second region of isolation region 206 having a height h2, the isolation devices in region 206 may be discontinuous for the depth of photodiodes in the nested sub-pixels 200.

The leaking of charge from one photodiode region of a sub-pixel into another photodiode region of another sub-pixel is generally referred to as electrical cross-talk. Because a single color filter is formed over nested sub-pixels 200, the inner sub-pixel 202 and outer sub-pixel 204 receive incident light 210 of the same color. As a result, photogenerated charge that diffuses from outer sub-pixel 204 across isolation region 206 into inner sub-pixel 202 corresponds to charge produced in response to the same color that produced photogenerated charges in inner sub-pixel 202. The electrical cross talk between photodiode regions in sub-pixels 202 and 204 is therefore cross-talk between photodiode regions receiving light of the same color, and is therefore manageable. The electrical cross talk between photodiodes in sub-pixels 202 and 204 may be accounted for or managed during readout of the pixel 22 in which nested sub-pixels 200 are located, or after the readout of the pixel 22 in which the nested sub-pixels 200 are located.

During a light collecting interval, light 212 incident on nested sub-pixels 200 may be absorbed by inner sub-pixels 202 and outer sub-pixels 204 in respective pixels 22 of FIG. 1. As described above in connection with FIG. 2A, the outer sub-pixel 204 has a more sensitive light collecting area compared to inner sub-pixel 202 due to at least the larger size of outer sub-pixel 204 and the one or more microlenses formed on nested sub-pixels 200 to direct light toward outer sub-pixel 204, or equivalently, away from inner sub-pixel 202. As a result of outer sub-pixel 204 having a more sensitive light collecting area, the number of photogenerated charges in outer sub-pixel 204 after exposure to incident light 212 may be larger than the number of photogenerated charges in inner sub-pixel 202 after exposure to the incident light 210.

Figure 4:
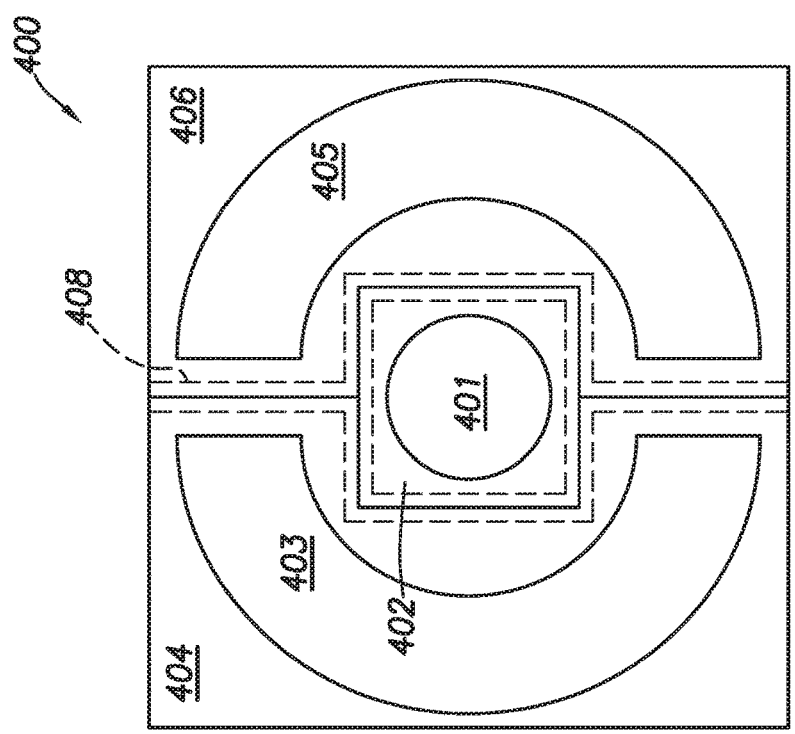
FIG. 4 is a surface view of nested sub-pixels with an inner sub-pixel having a circular light collecting surface that is surrounded by an outer sub-pixel group of two sub-pixels, in accordance with an embodiment.

When a first sub-pixel structure is said to be nested within a second sub-pixel structure, it is entailed that the first sub-pixel structure is laterally surrounded by the second sub-pixel structure as illustrated in at least FIGS. 2-4. Taking FIG. 2 as an example, it can be appreciated that the outer sub-pixel structure 204 laterally surrounds the inner sub-pixel structure 202. In other words, outer sub-pixel 204 surrounds the inner sub-pixel 202 except at upper surface 216 and lower surface 218 of the inner sub-pixel 202 (i.e., outer sub-pixel 204 laterally surrounds inner sub-pixel 202). When a first sub-pixel structure is said to be nested within a second sub-pixel structure, it is also entailed that no additional intervening pixels or sub-pixels are formed in a region between the first and second sub-pixels. Again, taking FIG. 2 as an example, it can be appreciate that any space between sub-pixels 202 and 204 is free from additional pixel or sub-pixel structures.

Informally, nesting may be a transitive function, in that when a first sub-pixel is nested within a second sub-pixel and the second sub-pixel is in turn nested within a third sub-pixel, the first sub-pixel may be said to be "nested" within the third sub-pixel. Formally, however, two sub-pixels may properly thought to be nested when one of the sub-pixels laterally surrounds the other sub-pixel and when any space between the sub-pixels is devoid of any other pixel or sub-pixel structures. When a first sub-pixel is nested within a second sub-pixel the aforementioned formal sense, the second sub-pixel can also be said to "immediately surround" the first sub-pixel.

While the above formal definition of nesting or "immediate surrounding" was described in connection with two sub-pixels, a sub-pixel group may also be properly be thought to immediately surround another sub-pixel or sub-pixel group. When a sub-pixel is laterally surrounded by a sub-pixel group that includes multiple sub-pixels, and when any space between the sub-pixel and the sub-pixel group is devoid of any other sub-pixels or pixels, the sub-pixel is immediately surrounded by, or nested within, the sub-pixel group. In a similar manner, a first sub-pixel group may be immediately surrounded by, or nested within, a second sub-pixel group.

FIG. 3 shows an illustrative pixel circuit 300 for nested sub-pixels having two photodiodes within the outer sub-pixel 204. Alternatively, the pixel circuit 300 may be considered to have an outer sub-pixel group having two sub-pixels, each with a single photodiode. For simplifying the explanation of the pixel circuit 300, it will be assumed that the outer sub-pixel group has two sub-pixels, each with a respective photodiode. Photodiode PD1A may be a photodiode associated with a first one of the sub-pixels in the outer sub-pixel group. Photodiode PD1B may be a photodiode associated with a second one of the sub-pixels in the outer sub-pixel group. Photodiode PD2 may be a photodiode associated with an inner sub-pixel. To avoid obscuring the salient features of the present embodiment, it will be assumed that the inner sub-pixel group has only a single sub-pixel. Generally, the inner sub-pixel group and the outer sub-pixel group of nested sub-pixels or a toroid pixel may have any number or associated sub-pixels, with each of the constituent sub-pixels having any number of photodiodes formed within them.

Photodiodes PD1A and PD1B in the outer sub-pixel group may have respective overflow transistors 302 and 308 that can be controlled by control signals AB1A and AB1B provided by control circuitry on the image sensor 16 or provided by control circuitry in the storage and processing circuitry 18 coupled to the image sensor 16. In the event that photodiodes PD1A and PD1B are saturated, charges may be discarded by opening the overflow transistors 302 and 308 (by, for example, asserting the AB1A and AB1B control signals) and thereby transferring excess charges to a power supply (represented by $V_{DD}$). The photodiode PD2, despite having a smaller charge storage capacity, may not need an associated overflow transistor due to its reduced light sensitivity. However, photodiode PD2 may be provided with an overflow transistor in some embodiments.

Transfer transistors 304, 306, and 310 may be used to transfer charges from the photodiodes PD1A, PD2, and PD1B, respectively. Control signals TX1A, TX2, and TX1B may be used to control transfer transistors 304, 306, and 310, and may be provided by control circuitry on the image sensor 16 or provided by control circuitry in the storage and processing circuitry 18 coupled to the image sensor 16. Charges from one or more of these photodiodes may be transferred to and stored on the capacitive node $C_{FD}$. In some embodiments, charges from these photodiodes may be transferred to and stored on both the capacitive node $C_{FD}$ and the capacitive node $C_{LG}$, when the gain control transistor 314 is opened (by, for example, asserting the GAIN_CTRL control signal). The GAIN_CTRL control signal may be provided by control circuitry on the image sensor 16 or provided by control circuitry in the storage and processing circuitry 18 coupled to the image sensor 16. Though the capacitive nodes $C_{FD}$ and $C_{LG}$ are represented as capacitors in the pixel circuit 300, they may be charge storage nodes or storage gate transistors. $C_{FD}$ may be referred to as a floating diffusion node.

A source follower transistor 316 may produce an output at its drain terminal 320 that is proportional to, or represents the amount of charge stored on the floating diffusion node $C_{FD}$. The output at the drain terminal 320 of the source follower transistor 316 may also represent a charge on both the floating diffusion node $C_{FD}$ and the capacitive node $C_{LG}$, in the event that the GAIN_CTRL signal is asserted, opening the gain control transistor 314. When the RS signal controlling the row select transistor 318 is asserted, a signal may be output to the COL_OUT line 322 which is the column output line associated with the pixel. To reset the charges on the capacitive nodes $C_{LG}$ and $C_{FD}$, the reset transistor 312 may be opened by asserting the FD_RST signal while the GAIN_CTRL signal is also asserted. The FD_RST and RS control signals may be provided by control circuitry on the image sensor 16 or provided by control circuitry in the storage and processing circuitry 18 coupled to the image sensor 16.

There may be, in some instances, high brightness image scenes that cause the photodiode(s) in the outer sub-pixel 204 to saturate with light. Because the light collection area of the photodiode(s) in the outer sub-pixel 204 is greater than the light collection area of the photodiode(s) in the inner sub-pixel 202, and light is directed away from the inner sub-pixel 202 and toward the outer sub-pixel 204, the photodiode(s) in the outer sub-pixel 204 may be saturated (i.e., filled to or beyond their charge storage capacity) during an integration or light-collecting interval (i.e., a period between a reset and readout/charge-transfer of a photodiode), despite the higher charge storage capacity of the photodiode(s) in the outer sub-pixel 204. When a photodiode is saturated, its output may be considered unusable. In the event that the photodiodes in the outer sub-pixel saturate in a high brightness scene, or collect charges that exceed the storage capacity of the floating diffusion node $C_{FD}$ and the capacitive node $C_{LG}$, the charges from the photodiode PD2 in the inner sub-pixel group may be utilized to form an image signal of the high brightness scene (as the photodiode PD2 will likely not have saturated due to its low light sensitivity relative to the light sensitivity of the photodiodes PD1A and PD1B). In such an instance, only the charges from PD2 may be read out to the floating diffusion node $C_{FD}$ by asserting the TX2 control signal, thereby opening the transfer gate 306.

In medium brightness image scenes, the photodiodes PD1A/PD1B in the outer sub-pixel group may approach saturation or collect charges that exceed the capacity of the floating diffusion node $C_{FD}$. If it is expected that a photodiode will approach saturation, charges may be transferred out of the photodiode before the end of a desired integration or light-collecting interval. Or, in such a high brightness scene, the GAIN_CTRL control signal may be asserted, so that charges can be stored on both the floating diffusion node $C_{FD}$ and the capacitive node $C_{LG}$. Additionally, if there is a risk that the photodiodes PD1A or PD1B in the outer sub-pixel group may saturate, it may be desirable to assert the TX1A and TX1B control signals to open the transfer gates 304 and 310 before the end of the integration interval for the outer sub-pixel group so that the charges can be stored on the floating diffusion node $C_{FD}$ (and, if desired, the capacitive node $C_{LG}$, by opening the gain control transistor 314).

In low brightness image scenes, the charges accumulated in the photodiodes PD1A/PD1B (which have high light sensitivity relative to the photodiode PD2) in the outer sub-pixel group may be transferred and read out to form the image signal for that pixel.

FIG. 4 is a surface view of nested sub-pixels with an inner sub-pixel having a circular light collecting surface that is surrounded by an outer sub-pixel group of two sub-pixels, in accordance with an embodiment. FIG. 4 is a surface view of nested sub-pixel groups 400 in a pixel 22 of array 20. Nested sub-pixel groups 400 may be an alternate embodiment to the nested sub-pixel groups shown in FIG. 2. FIG. 4 and FIG. 2A differ in that the outer sub-pixel 204 in FIG. 2A may be divided into an outer left sub-pixel 404 and an outer right sub-pixel 406 in FIG. 4. Additionally, the outer boundary of the inner sub-pixel 402 in FIG. 4 is square or rectangular, while the outer boundary of the inner sub-pixel 202 in FIG. 2A is circular or elliptical. However, in the context of FIG. 4, the inner sub-pixel 402 may have a circular or elliptical outer boundary without departing from the scope of the present invention. Outer left sub-pixel 404 and outer right sub-pixel 406 may form an outer sub-pixel group, in which the inner sub-pixel 402 is nested. The descriptions of sub-pixel structure described in FIG. 2B is also applicable to the nested sub-pixels 400 of FIG. 5, with the necessary modifications that take into account the division of outer sub-pixel 204 into outer left sub-pixel 204 and outer right sub-pixel 206. An example of such a necessary modification is the shape of the isolation region 408. Similar to FIGS. 2A and 2B, in which the isolation region 206 is formed between sub-pixels 202 and 204, the isolation region 408 is formed between each of the sub-pixels 402, 406, and 408. Additionally, the descriptions related to the placement of one or more microlenses over nested sub-pixels 200 in FIG. 2 are also applicable to the nested sub-pixel 500 of FIG. 5, with the necessary modifications that take into account the division of outer sub-pixel 204 into outer left sub-pixel 404 and outer right sub-pixel 406.

Generally, one or more outer sub-pixels or sub-pixel groups having either rectangular, square, elliptical, or circular inner boundaries may be divided into respective divided sub-pixel groups having additional sub-pixels compared to the original sub-pixel or sub-pixel groups.

Within the inner sub-pixel 402, a photodiode 401 may be formed. The light collecting surface/area of the photodiode 401 may be a circle and may occupy only a portion of the inner sub-pixel 402. Within the outer sub-pixel 404, a photodiode 403 may be formed. The light collecting surface/area of the photodiode 403 may have a half-torus or half-donut shape. Within the outer sub-pixel 406, a photodiode 405 may be formed. The light collecting surface/area of the photodiode 405 may have a half-torus or half-donut shape.

Figure 5:
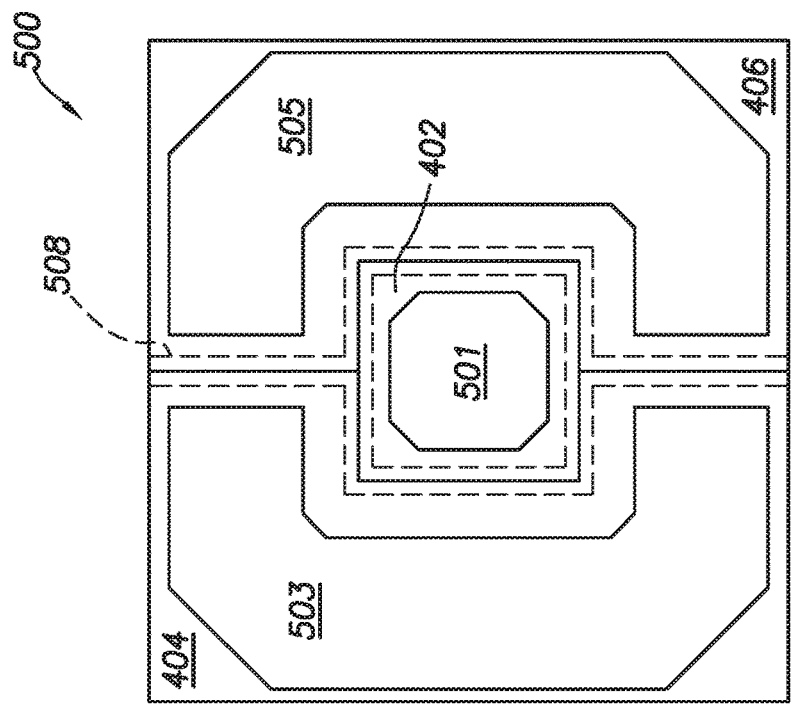
FIG. 5 is a surface view of nested sub-pixels with an inner sub-pixel having a polygonal light collecting surface that is surrounded by an outer sub-pixel group of two sub-pixels, in accordance with an embodiment.

FIG. 5 is a surface view of nested sub-pixels with an inner sub-pixel having a polygonal light collecting surface that is surrounded by an outer sub-pixel group of two sub-pixels, in accordance with an embodiment. FIG. 5 is substantially similar to FIG. 4, but differs in that the photodiodes formed in the outer sub-pixel group have a light collecting surface/ area with a polygonal shape and the photodiode in the inner sub-pixel group also has a light collecting surface/area with a polygonal shape. The photodiode 501 in the inner sub-pixel 402 may have an octagonal shape that is formed in only a portion of the area of the inner sub-pixel 402. Generally, however, the shape of the photodiode 501 may be a polygon of having any number of sides greater than three. The photodiode 503 may be an 11-sided polygon with a shape that approximates a half torus or a half donut. Generally, the shape of the photodiode 501 may be a polygon of having any number of sides greater than three that preferably fills or occupies a portion of the outer left sub-pixel 404. The photodiode 505 may be an 11-sided polygon with a shape that approximates a half torus or a half donut. Generally, the shape of the photodiode 505 may be a polygon of having any number of sides greater than three that preferably fills or occupies a portion of the outer right sub-pixel 404.

Figure 6A:
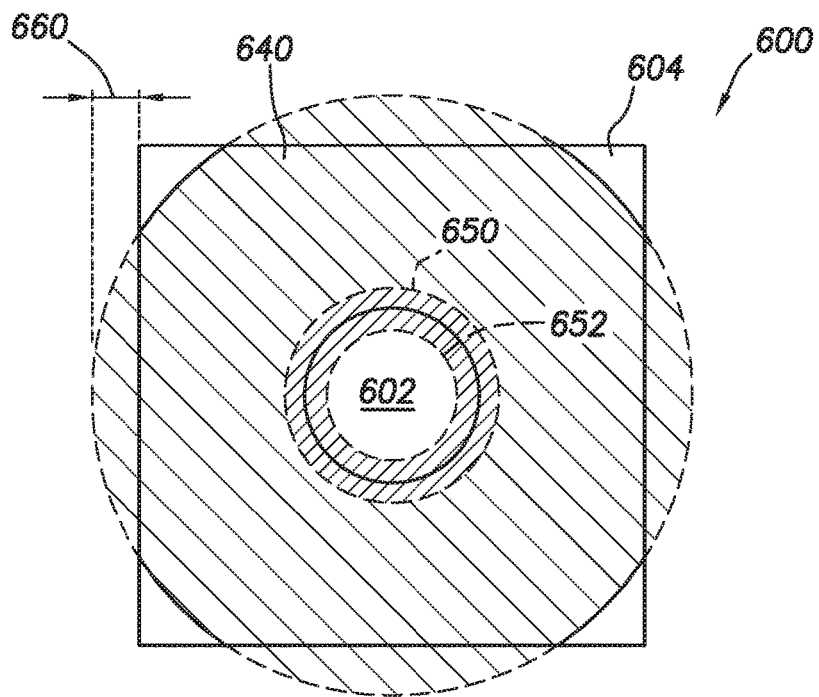
FIG. 6A is a diagram of toroidal microlens placement formed over nested sub-pixels, in accordance with an embodiment.

FIG. 6A is a diagram of toroidal microlens placement formed over nested sub-pixels, in accordance with an embodiment. FIG. 6A illustrates a toroidal microlens 640, which may have either a first inner boundary 650 or a second inner boundary 652. In certain embodiments where toroidal microlens 640 has the first inner boundary 650, toroidal microlens may not overlap inner sub-pixel 602. In other words, toroidal microlens 640 with inner boundary 650 may be formed over only the outer sub-pixel 604. In other embodiments, where toroidal microlens 640 has the second inner boundary 652, toroidal microlens may partially overlap the inner sub-pixel 602. When toroidal microlens 640 only overlaps outer sub-pixel 604 (i.e., when toroidal microlens 640 has the second inner boundary 652), the toroidal microlens 640 may direct light to an outer sub-pixel 604 without directing any light to inner sub-pixel 602. However, microlens 640 may alternatively overlap inner sub-pixel 602, at least partially (i.e., when toroidal microlens 640 has the first inner boundary 650), so that the light (i.e., photons) incident on the portion of microlens 640 that at least partially overlaps inner sub-pixel 602 may be re-directed toward the outer sub-pixel 604 by the toroidal microlens 640. Because the toroidal microlens 640 only directs light to the outer sub-pixel 604, the sensitivity of the light collecting area of the outer sub-pixel 604 may be increased. The sensitivity of the light collecting area of the outer sub-pixel 604 may be greater than the sensitivity of the light collecting area of the inner sub-pixel 602.

The toroidal microlens 640 of FIG. 6A is shown to extend beyond the outer boundary of an outer sub-pixel 604 (namely, in the region 660 beyond the outer sub-pixel 604). As an example, a portion of the toroidal microlens 640 is shown to be formed in a region 660 that extends beyond the outer boundary of the outer sub-pixel 604. When multiple nested sub-pixels 600 are placed in an array, the toroidal microlenses 640 of adjacent nested sub-pixels 600 may overlap as a result of the toroidal microlens 640 extending beyond the outer boundary of an outer sub-pixel 604.

However, the extension of toroidal microlens 640 beyond the outer boundary of the outer sub-pixel 604 may, in a finished device, be unnoticeable or even absent, as the extension microlens 640 beyond the boundary of an outermost sub-pixel group (outer sub-pixel 604, in this example) may be relevant to pixels that have been processed only up to an intermediate lithography step, specifically, to an intermediate lithography step before a re-flow process has been applied to pixels and their associated microlenses. After the re-flow process has been applied to the pixels, any extension of a microlens beyond the outer boundary may be reduced or eliminated, as illustrated in FIG. 6B, where the microlenses 642-1 and 642-2 do not extend beyond the outer boundary of the respective outer sub-pixel 604 over which they are respectively formed.

Figure 6B:
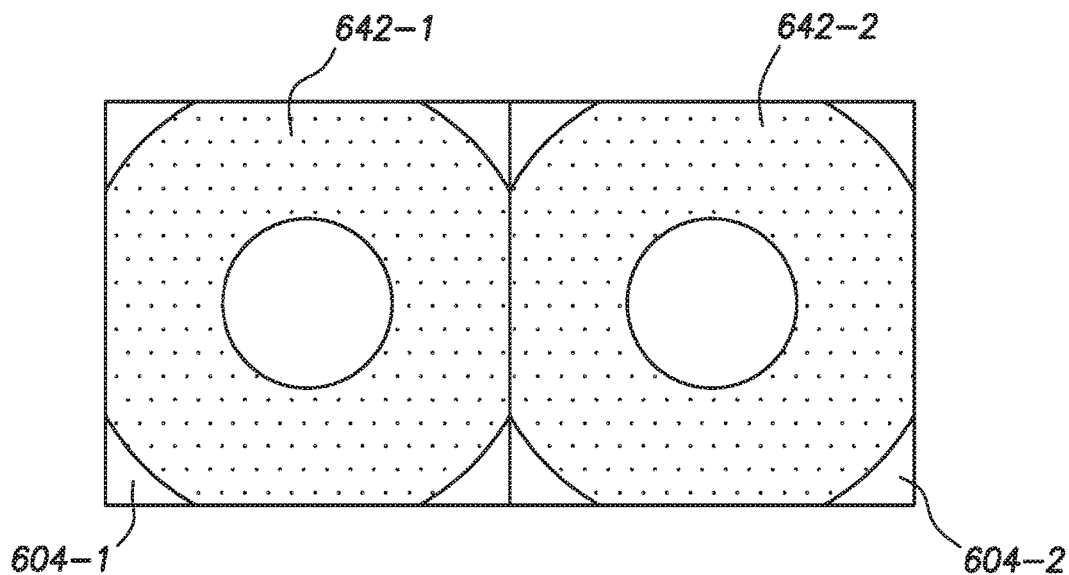
FIG. 6B is a diagram of an alternate placement of toroidal microlenses formed over adjacent nested sub-pixels, in accordance with an embodiment.

FIG. 6B is a diagram of an alternate placement of toroidal microlenses formed over adjacent nested sub-pixels, in accordance with an embodiment. FIG. 6B illustrates a toroidal microlens 642-1 formed over a given pixel (such as pixel 22 of FIG. 1) having an inner sub-pixel 602-1 that is nested within outer sub-pixel 604-1. As described in connection with FIG. 6A, the toroidal microlens 642 of FIG. 6B is illustrated in accordance with the embodiment of FIG. 2A, though toroidal microlens 642 may be used in conjunction with any sub-pixel configuration. In other words, the toroidal microlens 642 may be used in conjunction with pixels having multiple nested sub-pixel groups surrounding an inner sub-pixel having a circular, elliptical, square, or rectangular surface boundary. Pixels 22 that include one, two, or any number of sub-pixel groups that surround an inner sub-pixel having a circular, elliptical, square, or rectangular surface boundary may include a toroidal microlens 642.

Toroidal microlens 642-1 may be adjacent to but non-overlapping with another toroidal mircolens 642-2 formed over another pixel having an inner sub-pixel 602-2 that is nested within outer sub-pixel 604-2 and that is adjacent to the given pixel. Toroidal microlenses 642 of adjacent nested sub-pixels 600 may be directly adjacent and may contact each other at an interface. However, each of the toroidal microlenses 642 associated with a given pixel 22 having nested sub-pixels 600 may be contained within the outer boundary of the outermost sub-pixel or sub-pixel group, such as sub-pixel 604, as illustrated in FIG. 6B.

Figure 7:
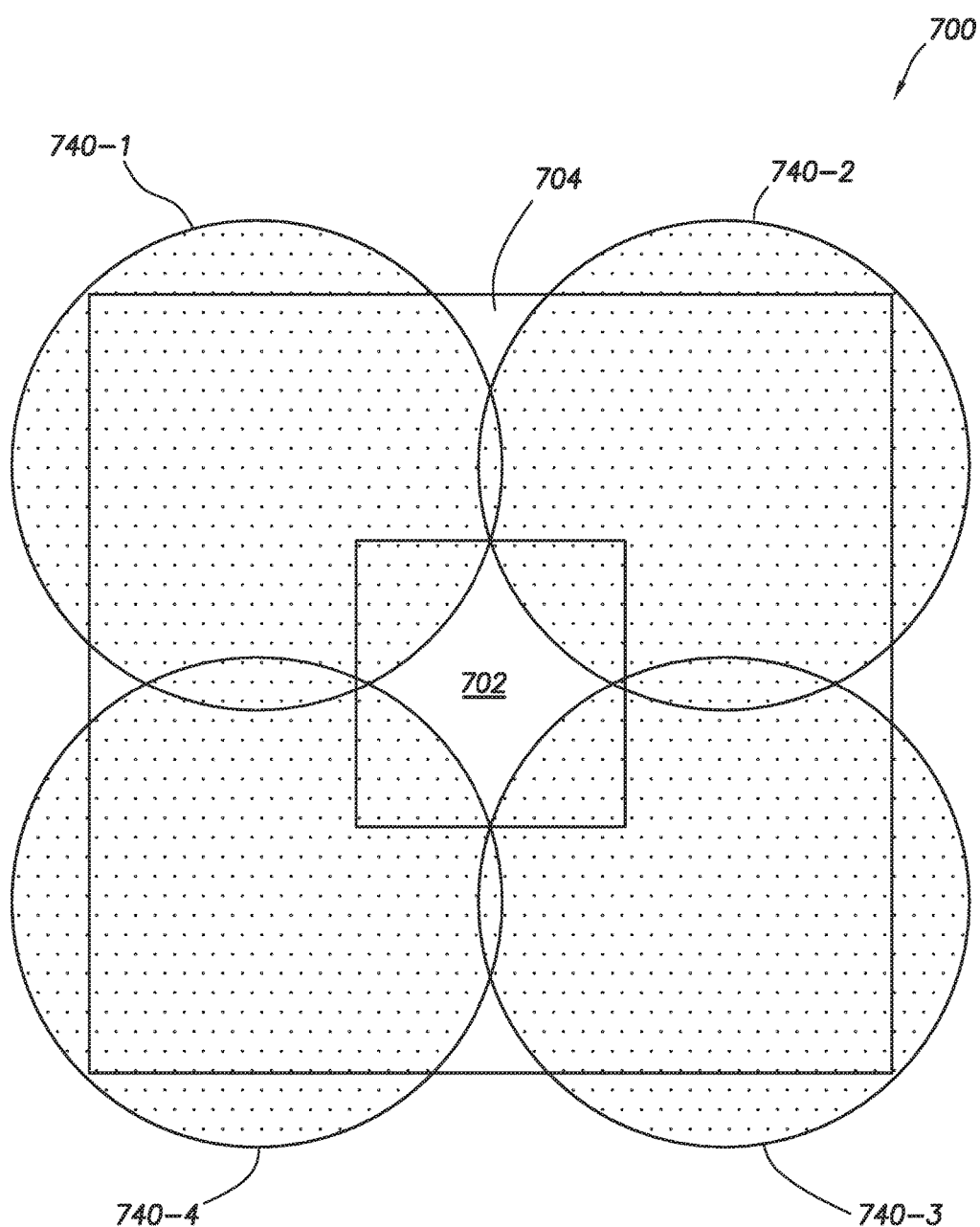
FIG. 7 is a diagram of circular microlens placement over nested sub-pixels, in accordance with an embodiment.

FIG. 7 is a diagram of circular microlens placement over nested sub-pixels, in accordance with an embodiment. FIG. 7 illustrates the placement of circular microlenses over nested sub-pixels 700 in a pixel 22 of array 20. Although the inner sub-pixel 702 and the outer sub-pixel 704 of FIG. 7 are illustrated in accordance with the embodiment of FIG. 2A, the placement of circular microlenses 740-1, 740-2, 740-3, and 740-4 may be used in conjunction with any of the sub-pixel configurations of FIGS. 3-6. Circular microlenses 740-1, 740-2, 740-3, and 740-4 may be centered outside the boundary of inner sub-pixel 702. The microlenses 740-1, 740-2, 740-3, and 740-4 may be centered over regions of the outer sub-pixel 704. FIG. 7 illustrates four microlenses 740-1, 740-2, 740-3, and 740-4 per pixel. The placement of microlenses 740-1, 740-2, 740-3, and 740-4 over nested sub-pixels 700 may direct light to only outer sub-pixel 704. The placement of microlenses 740-1, 740-2, 740-3, and 740-4 as illustrated in FIG. 7 may increase the sensitivity of the light collecting area of outer sub-pixel 704 relative to an arrangement in which microlenses 740-1, 740-2, 740-3, and 740-4 are not formed at all. As shown in FIG. 7, microlenses 740-1, 740-2, 740-3, and 740-4 may partially overlap inner sub-pixel 702. However, increase in sensitivity for the light collecting area of inner sub-pixel 702 caused by microlenses 740-1, 740-2, 740-3, and 740-4 partially overlapping inner sub-pixel 702 may be negligible.

FIG. 7 illustrates microlenses 740-1, 740-2, 740-3, and 740-4 extending beyond the outer sub-pixel 704. However, the extension of microlenses 740-1, 740-2, 740-3, and 740-4 beyond the outer sub-pixel may correspond to an intermediate step in the fabrication of microlenses 740-1, 740-2, 740-3, and 740-4 as described above in connection with FIG. 6.

Figure 8:
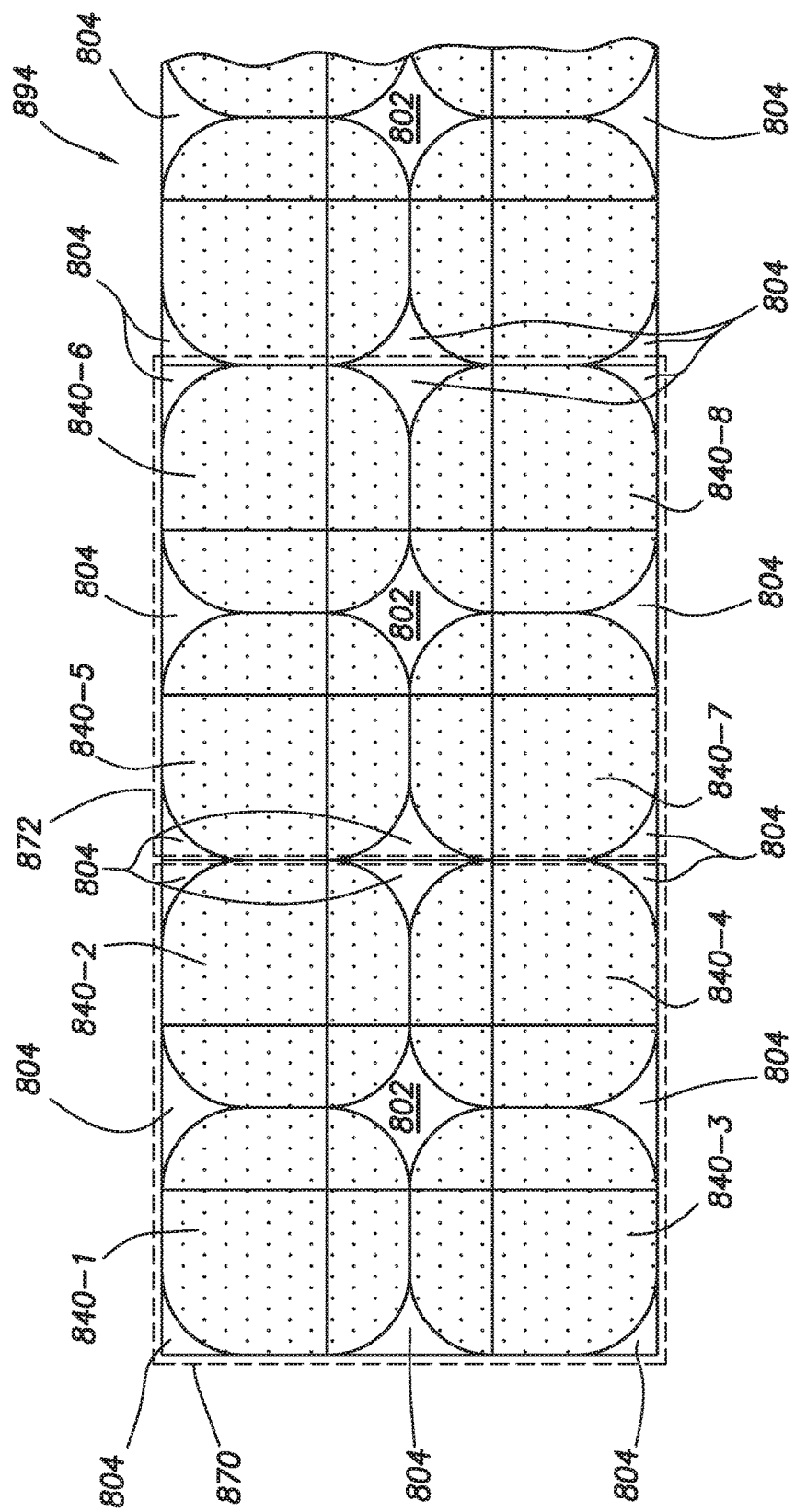
FIG. 8 illustrates microlenses formed adjacent to one another in accordance with an embodiment.

FIG. 8 illustrates microlenses formed adjacent to one another in accordance with an embodiment. FIG. 8 illustrates a plan view 894 of microlenses 840 formed over a structure 3-by-3 array of sub-pixels 802 and 804, where the sub-pixels 804 form an outer sub-pixel group, and where the sub-pixel 802 forms an inner sub-pixel that is nested within the outer sub-pixel group. The microlenses 840 in FIG. 8 do not overlap one another, but are adjacent to one another. Microlenses 840 do not overlap one another within a pixel 870 or 872, or between pixels 870 and 872. Microlenses 840 may be formed over color filters such as a red color filter, a green color filter, a blue color filter, a clear filter, an infrared pass filter, or any other suitable color filter or hybrid color filter that includes clear regions and color filter regions. The plan view 894 of FIG. 8 shows that between the microlenses 840, gaps may be present. These gaps may be eliminated, or the size and shapes of these gaps may modified based on the method of disposing and forming the microlenses 840.

Figure 9:
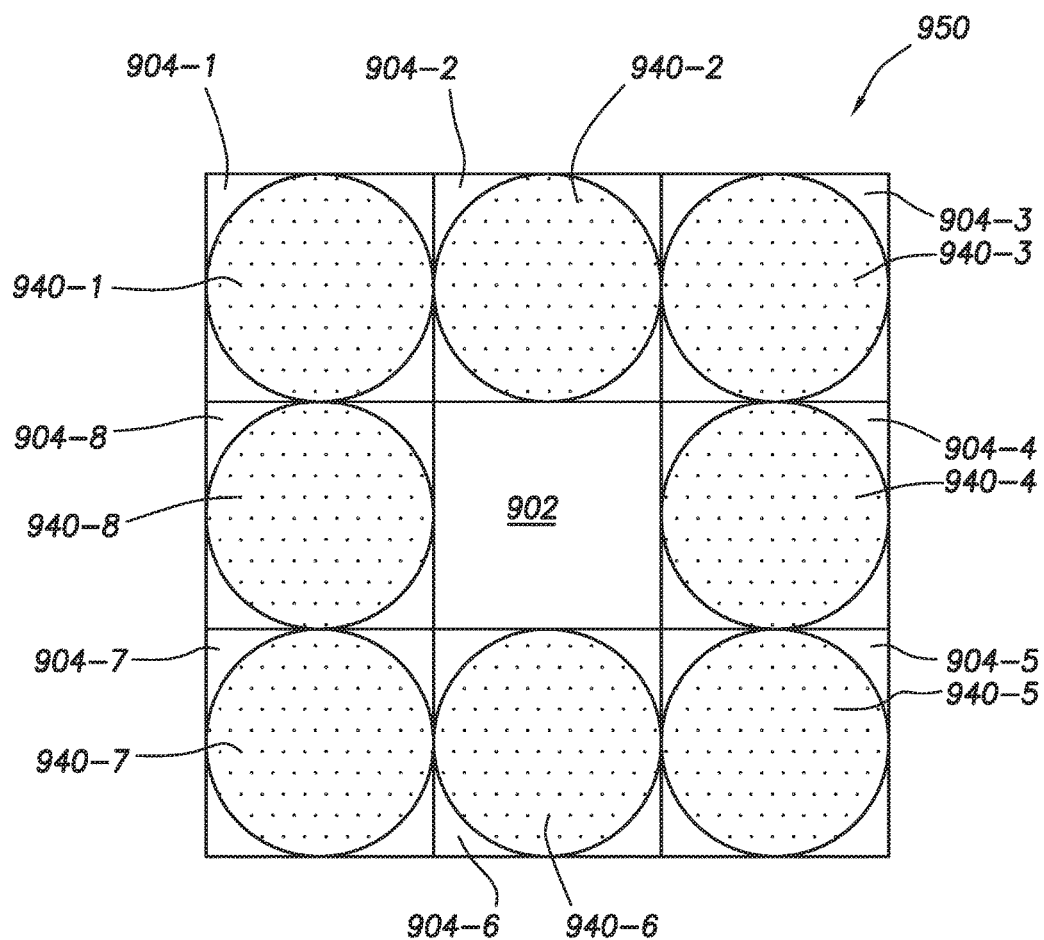
FIG. 9 is a diagram of an alternate microlens placement over only each of the sub-pixels of an outer sub-pixel group arranged in a grid layout, in accordance with an embodiment.

FIG. 9 is a diagram of an alternate microlens placement over only each of the sub-pixels of an outer sub-pixel group arranged in a grid layout, in accordance with an embodiment. Nested sub-pixels 900 are illustrated as having a 3 by 3 array of square image pixels. The eight square sub-pixels 904 on the periphery of nested sub-pixels 900 may be considered an outer sub-pixel group that surrounds inner sub-pixel 902. Generally, the sub-pixels 904 in the outer sub-pixel group need may not be square, but may still be equally sized. Sub-pixels 904 in the outer sub-pixel group may each have the same dimensions as inner sub-pixel 902. Viewed in this way, the pixel 900 having nested sub-pixels may be seen as an embodiment in which an outer sub-pixel group has been divided into eight sections, divided into sub-pixels 904-1, 904-2, 904-3, 904-4, 904-5, 904-6, 904-7, and 904-8. The sub-pixels 904-1, 904-2, 904-3, 904-4, 904-5, 904-6, 904-7, and 904-8 may collectively be referred to as the outer sub-pixel group 904. The placement of circular microlenses 940 may correspond to a one-to-one placement of microlenses for each sub-pixel. Microlenses 940-1, 940-2, 940-3, 940-4, 940-5, 940-6, 940-7, and 940-8 may be respectively formed over the sub-pixels 904-1, 904-2, 904-3, 904-4, 904-5, 904-6, 904-7, and 904-8 in the outer sub-pixel group 904.

The placement of microlenses 940 over sub-pixels in the outer group 904 may direct light to outer sub-pixel group 904. Specifically, the each microlenses 940 may direct light to only the respective sub-pixel in outer sub-pixel group 904 over which it is formed. The placement of microlenses 940 as illustrated in FIG. 9 may increase the sensitivity of the light collecting area of outer sub-pixel group 904 relative to an arrangement in which microlenses 940 are not formed at all. As shown in FIG. 9, a microlens may be omitted over inner sub-pixel 902. Alternatively, a microlens that is optimized to prevent the sensitivity of the light collecting area of inner sub-pixel 902 from increasing may be formed over the inner sub-pixel 902. However, in certain embodiments it may be preferable to simply omit forming any sort of microlens over the inner sub-pixel 902 to avoid increasing the sensitivity for the light collecting area of inner sub-pixel 902. In certain embodiments, instead of an individual microlens 940 being provided for each sub-pixel 904 of the outer sub-pixel group, a toroidal microlens 640 of FIG. 6A or a toroidal microlens 642 of FIG. 6B may be formed over the sub-pixels 904 of the outer photodiode group.

Figure 10:
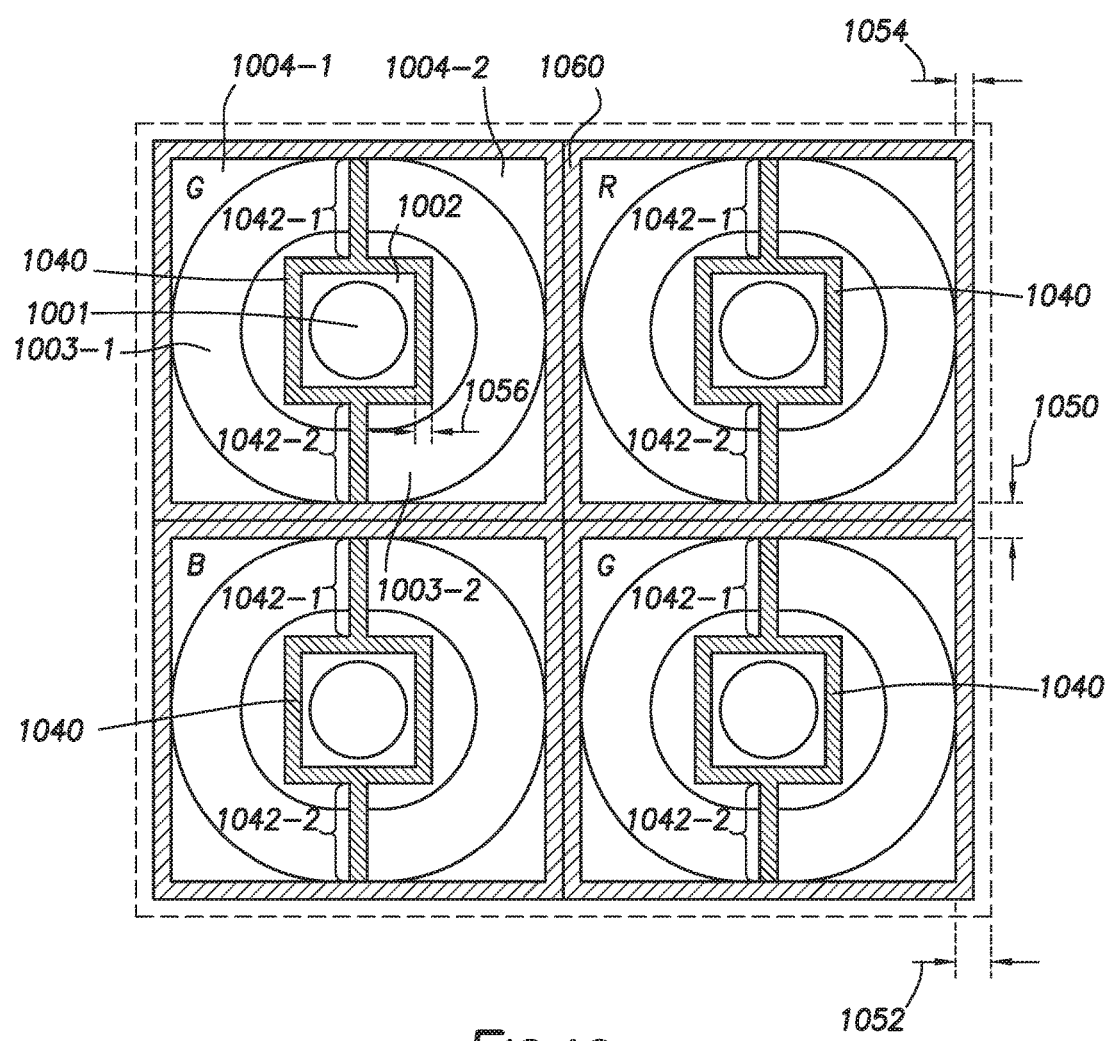
FIG. 10 is a surface view of a Bayer-pattern unit cell grid of two rows and two columns of nested sub-pixels provided with in-pixel light shield structures, in accordance with an embodiment.

FIG. 10 is a surface view of a Bayer-pattern unit cell grid of two rows and two columns of nested sub-pixels provided with in-pixel light shield structures, in accordance with an embodiment. Nested sub-pixels 1002 and 1004 (labeled only in connection with the top-left green pixel for simplicity) may be nested sub-pixels having any surface boundary geometry. As an example, the nested sub-pixels 1002 and 1004 may have polygonal or elliptical surface boundaries. For illustrative purposes of the preferred embodiment, the outer sub-pixels 1004 are shown as having a rectangular boundary, as are the outer sub-pixels 1002. The nested sub-pixels labeled with R, G, and B respectively correspond to pixels that have a red, green, or blue, color filter formed over them. Formed between, and separating adjacent nested sub-pixels or toroid pixels are inter-pixel optical isolation structures 1060. The shaded portion of the inter-pixel isolation structures 1060 may represent the portion of the inter-pixel isolation structures 1060 that are formed over a single unit cell grid of four pixels, and may extend to the width 1050 (when the array of pixels 22 is viewed as a whole and neighboring unit cell grids are considered). However, when considering only the view of a single unit cell (and not considering portions of the inter-pixel isolation structures 1060 that extend into neighboring pixels), the width of the inter-pixel isolation structures 1060 may be the width 1054 around the border of the unit cell. The width 1052 illustrated between the rows of adjacent pixels in the unit cell grid may be substantially equivalent to the width 1050 illustrated between columns of adjacent pixels. However, in some embodiments, the widths 1050 and 1052 of the inter-pixel isolation structures 1060 between rows and columns respectively, may be different.

The inter-pixel optical isolation structures 1060 may be used to form a grid separating the toroid pixels or nested sub-pixels from one another. Inter-pixel optical isolation structures 1060 may be formed using either an optically transparent dielectric material (such as silicon oxide, or more simply, oxide), an optically opaque material (such as metal), or a hybrid of optically transparent dielectric material and optically opaque material. The formation and structure of the hybrid inter-pixel optical isolation structures is described in greater detail in FIGS. 11A-11D. The inter-pixel optical isolation structures 1060 may be formed over the semiconductor substrate in which the nested sub-pixels 1002 and 1004 (or nested sub-pixels as shown in FIG. 2) are formed.

Generally, the inter-pixel optical isolation structures 1060 may serve to prevent high-angle light caused by undesired glare or lens flares that is incident upon a given pixel to impact (and thereby generate charge in) an adjacent pixel. When the inter-pixel optical isolation structures 1060 (or portions thereof) are formed of optically transparent dielectric material, it may be desirable for the material to have an index of refraction that is different than the index of refraction associated with color filter material formed adjacent to the inter-pixel optical isolation structures 1060 (shown in greater detail in FIG. 11D). High angle light incident upon a given pixel may first pass through the color filter associated with the pixel before reaching the inter-pixel optical isolation structure 1060 associated with the given pixel. When the inter-pixel optical isolation structure 1060 is optically transparent, it is desirable for the material used to form the structure 1060 to have a lower index of refraction than the color filter material that light incident upon the pixel passes through. When the inter-pixel optical isolation structures 1060 has a lower index of refraction in this manner, light incident upon the inter-pixel optical isolation structures 1060 within a certain range of angles will be reflected back into the pixel whose color filter it originally passed through due to the total internal reflection of light in the color filter material that is adjacent and abutted to the inter-pixel optical isolation structures 1060.

FIG. 10 also illustrates intra-pixel optical isolation structure 1040. Intra-pixel optical isolation structure 1040 may be formed around and adjacent to (but not directly over) the light collecting area associated with one or more inner sub-pixels (namely, the inner sub-pixel group) of nested sub-pixels. Intra-pixel optical isolation structures 1040 may completely surround the periphery of the light collecting area associated with the inner sub-pixel group of a toroid pixel. In embodiments where a toroid pixel has a single sub-pixel forming the inner sub-pixel group of the toroid pixel, the intra-pixel optical isolation structures 1040 may be formed over the perimeter of the single inner sub-pixel over the surface of the semiconductor substrate such that the structures 1040 completely surround the single sub-pixel. In embodiments in which the inner sub-pixel of nested sub-pixels is used to collect colored or infrared light (i.e., when the nested sub-pixels are color or infrared pixels), the intra-pixel optical isolation structures 1040 inner space may be filled with color filter material and may be formed such that they do not overlap any light-collecting portion of the inner sub-pixel such as the photosensitive region 1001 of the inner sub-pixel 1002. Similarly, the intra-pixel optical isolation structures 1040 may be non-overlapping with the photosensitive regions 1003-1 and 1003-2 of the outer left and outer right sub-pixels 1004-1 and 1004-2, respectively.

Intra-pixel optical isolation structures 1040 may be anchored or structurally coupled to the inter-pixel optical isolation structures 1060 by isolation fins 1042-1 and 1042-2. Isolation fins 1042, like the inter-pixel optical isolation structures 1060 and the intra pixel optical-isolation structures 1040, may be formed using either an optically transparent dielectric material (such as silicon oxide, or more simply, oxide), an optically opaque material (such as metal), or a hybrid of optically transparent dielectric material and optically opaque material. The isolation fins 1042 and the intra-pixel optical isolation structures may be formed in the same manner and using the same processing steps (including concurrent/common process steps) as the inter-pixel optical isolation structures 1060. Both the isolation fins 1042 and the intra-pixel optical isolation structures 1040 may be formed over an isolation region such as the isolation regions 408 and 508 of FIGS. 4 and 5. Generally, the isolation fins 1042 and the intra-pixel optical isolation structures 1040 may be formed over any region of the semiconductor substrate of a pixel that does not serve as a light-collecting surface/area of a photodiode in any of the sub-pixels of the pixel (i.e., nested sub-pixels or toroid pixels).

As described above in connection with the inter-pixel optical isolation structures 1060, the intra-pixel optical isolation structures 1040, in combination with the isolation fins 1042, may serve to prevent high-angle light caused by undesired glare or lens flares that is incident upon a given sub-pixel to impact (and thereby generate charge in) an adjacent sub-pixel. The intra-pixel optical isolation structures 1040 may prevent high angle light incident on one of the outer sub-pixels (such as the outer left sub-pixel 1004-1 or the outer right sub-pixel 1004-2) from impeding on (and generating charge in) the light collecting area of the photodiode in the inner sub-pixel (such as the photodiode 1001 in the inner sub-pixel 1002). Similarly, the intra-pixel optical isolation structures 1040 may prevent high angle light incident on the inner sub-pixel (such as inner sub-pixel 1002) from impeding on (and generating charge in) the light collecting area of the photodiodes in the outer sub-pixels (such as the photodiode 1003-1 in outer left sub-pixel 1004-1 or the photodiode 1003-2 in outer right sub-pixel 1004-2).

Figure 11A:
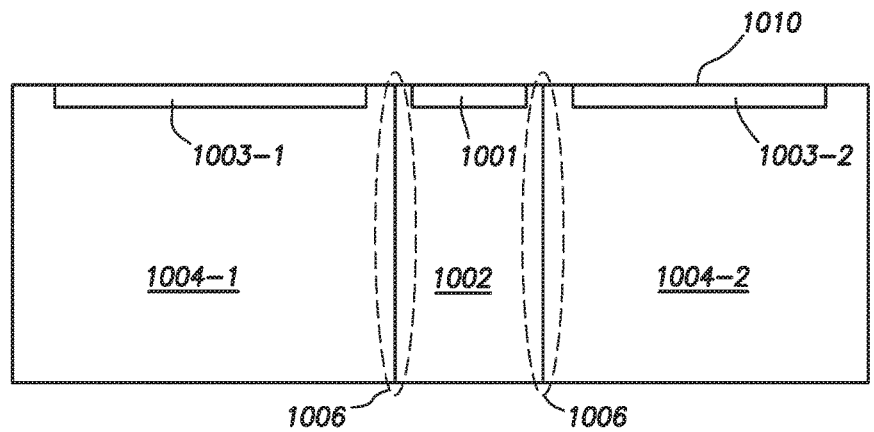
FIGS. 11A-11D illustrate processing stages associated with the formation of an in-pixel light shield structure to be filled with color filter material for an pixel having multiple light collecting areas, in accordance with an embodiment.
Figure 11B:
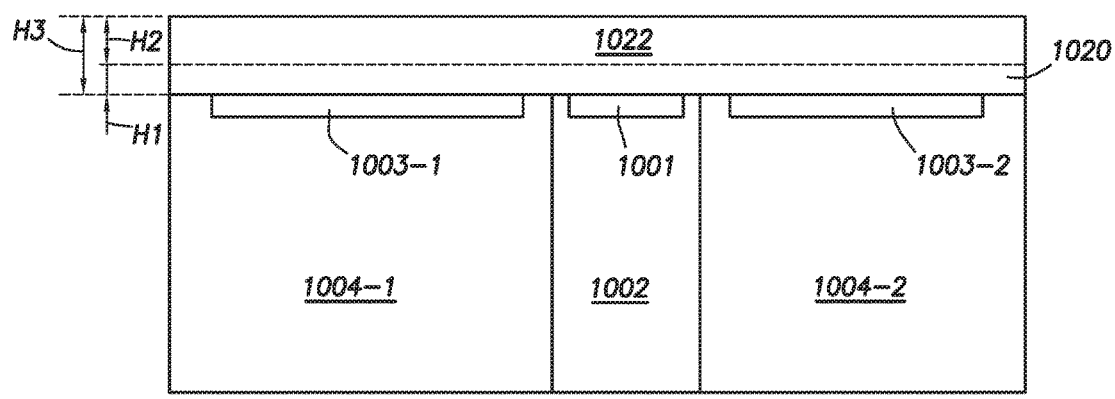
Figure 11C:
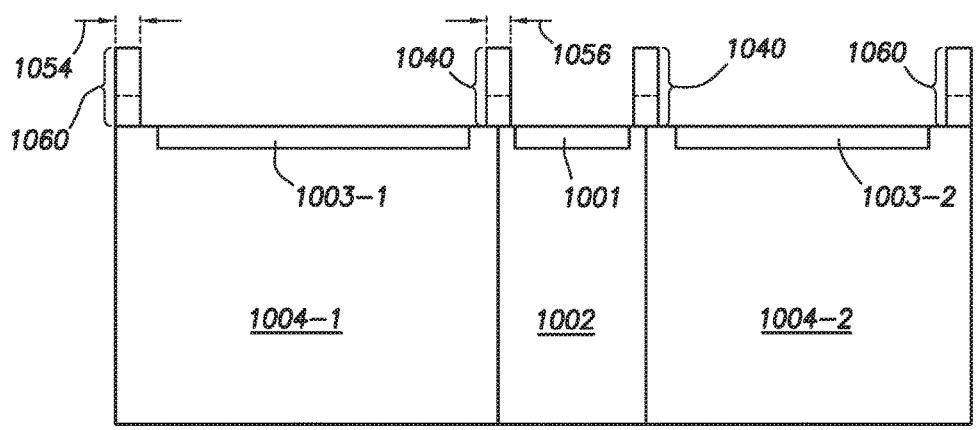
Figure 11D:
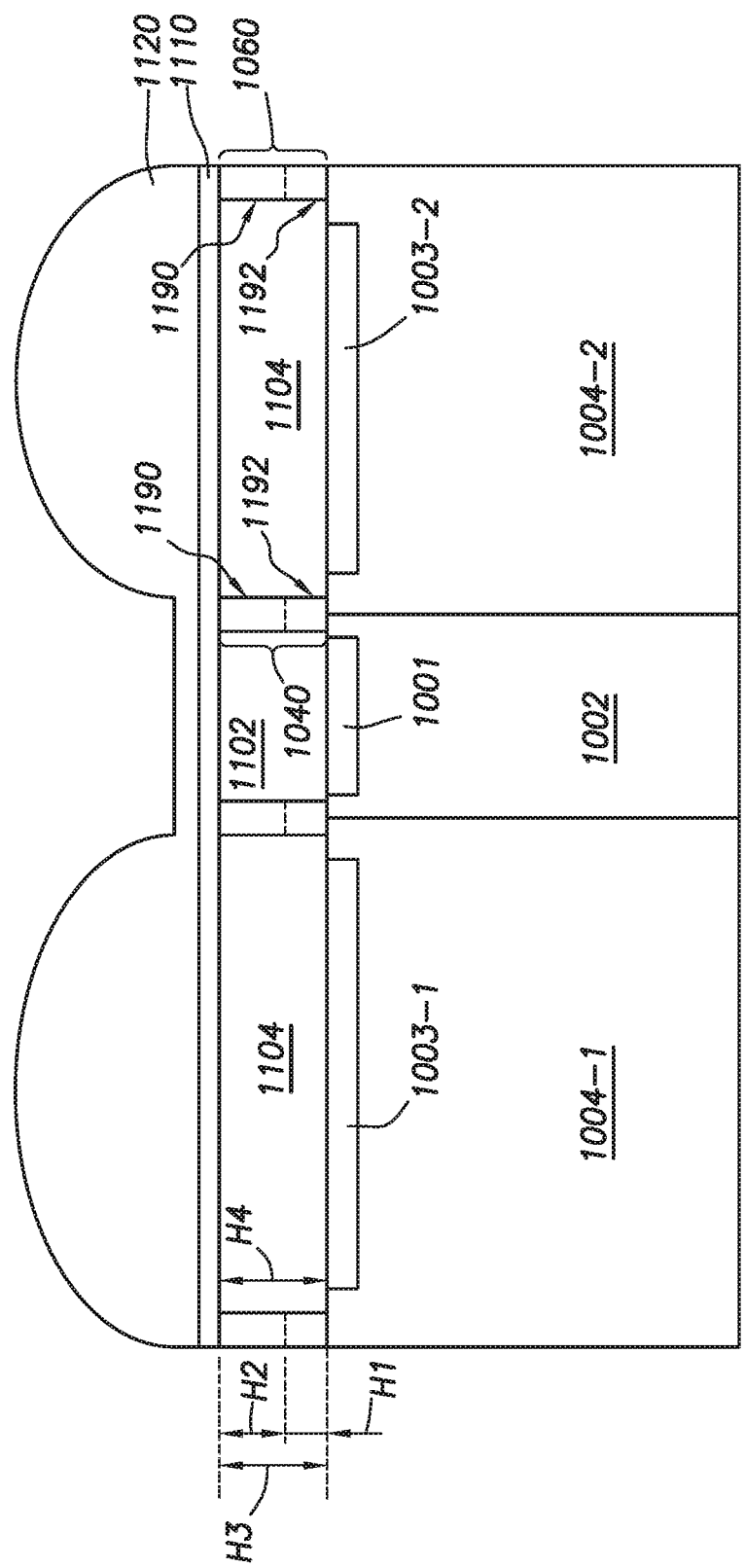

When the intra-pixel optical isolation structures 1040 and the isolation fins 1042 (or respective portions thereof) are formed of optically transparent dielectric material, it may be desirable for the material to have an index of refraction that is different than the index of refraction associated with color filter material formed adjacent to the intra-pixel optical isolation structures 1040 and the isolation fins 1042 (shown in greater detail in FIG. 11D). High angle light incident upon a given pixel may first pass through the color filter associated with a given one of the sub-pixels in the toroid pixel before reaching the intra-pixel optical isolation structure 1040 and/or the isolation fins 1042 associated with and adjacent to the given sub-pixel. When the intra-pixel optical isolation structure 1040 and/or the isolation fins 1042 are optically transparent, it is desirable for the material used to form the structure 1040 and/or the fins 1042 to have a lower index of refraction than the color filter material that light incident upon the given sub-pixel passes through. When the intra-pixel optical isolation structures 1040 and/or the isolation fins 1042 have a lower index of refraction in this manner, light incident upon the intra-pixel optical isolation structures 1040 and/or the fins 1042 within a certain range of angles will be reflected back into the sub-pixel whose color filter it originally passed through due to the total internal reflection of light in the color filter material that is adjacent and abutted to the intra-pixel optical isolation structures 1040 and/or the isolation fins 1042.

The walls of the intra-pixel isolation structures 1040 may have a thickness 1056. The thickness of the isolation fins 1042 may be the thickness 1056, the thickness of the walls of the intra-pixel isolation structures 1040. Alternatively, the isolation fins 1042 may have any thickness. Isolation fins 1042 may provide structural support to the intra-pixel optical isolation structures 1040, which without the isolation fins 1042, would be untethered or unanchored to any other structure formed over the semiconductor substrate in which the sub-pixels 1002 and 1004 are formed. Furthermore, just as the intra-pixel isolation structures 1040 optically isolate the inner subpixel 1002 from the sub-pixels in the outer sub-pixel group 1004 (such as the outer left sub-pixel 1004-1 and the outer right sub-pixel 1004-2), the isolation fins 1042 serve to optically isolate the outer left sub-pixel 1004-1 and the outer right sub-pixel 1004-2 from one another.

The interior space (i.e., the area over the inner sub-pixel 1002) of the intra-pixel isolation structures 1040 may be filled with color filter material. The exterior space of the intra-pixel isolation structures 1040 adjacent to the isolation fins 1042 (i.e., the space over one or more of the outer sub-pixels 1004) may also be filled with color filter material. The color filter material used to fill the interior space of the intra-pixel isolation structures 1040 may be different from the color filter used to fill the exterior space of intra-pixel isolation structures 1040. Alternatively, the color filter material used to fill the interior space of the intra-pixel isolation structures 1040 may be the same from the color filter used to fill the exterior space of intra-pixel isolation structures 1040. The filters used to fill either the interior space or the exterior space of the intra-pixel isolation structures 1040 may be red, green, blue, cyan, yellow, magenta, near-infrared, infrared, or even clear filters. Generally, any filter material (including band-pass and band-stop filters) for light can be used to fill the space within the intra-pixel isolation structures 1040 or outside intra-pixel isolation structures 1040.

Forming isolation fins 1042 such that high angle light incident on one of the sub-pixels of the outer sub-pixel group 1004 (such as, for example, the outer left sub-pixel 1004-1) does not pass through to another one of the sub-pixels of the outer sub-pixel group 1004 (such as, for example, the outer right sub-pixel 1004-2) may be advantageous when the image signals captured by the outer sub-pixels are read out separately. Moreover, such optical isolation may be advantageous for using the sub-pixels in phase detection applications when the image output of a first half-pixel (or the first half-pixels of multiple pixels) is compared to the image output of a second half-pixel (or the second half-pixels of multiple pixels) for determining whether or not focusing settings for an imager are appropriate.

FIGS. 11A-11D illustrate processing stages associated with the formation of an in-pixel light shield structure to be filled with color filter material for an pixel having multiple light collecting areas, in accordance with an embodiment. FIG. 11A shows a cross-sectional side view of a color pixel such as one of the color pixels shown in FIG. 10, prior to the formation of inter-pixel and intra-pixel isolation structures, color filters, and/or lenses. The pixel shown in FIG. 11A may correspond to nested sub-pixels having an outer sub-pixel group with two sub-pixels (i.e., an outer left sub-pixel group 1004-1 and an outer right sub-pixel group 1004-2), semiconductor substrate with an upper surface 1010 on which planarization layers (not illustrated) may be formed. These planarization layers may include multiple layers of materials having progressively increasing/decreasing indices of refraction to minimize the reflectivity of the upper surface 1010. The semiconductor substrate may include two outer sub-pixels such as the outer left sub-pixel 1004-1 and the outer right sub-pixel 1004-2. Photosensitive regions (i.e., photodiodes) 1003-1 and 1003-2 may be formed in the outer left sub-pixel 1004-1 and the outer right sub-pixel 1004-2, respectively. Nested within the outer sub-pixels 1004 may be the inner sub-pixel 1002. Photosensitive region (i.e., photodiode) 1001 may be formed in the inner sub-pixel 1002.

Isolation regions 1006 may be formed between the outer sub-pixels 1004 and the inner sub-pixel 1002. Isolation regions 1006 may be similar to the isolation regions 206 described above in connection with FIG. 2B.

Figure 12:
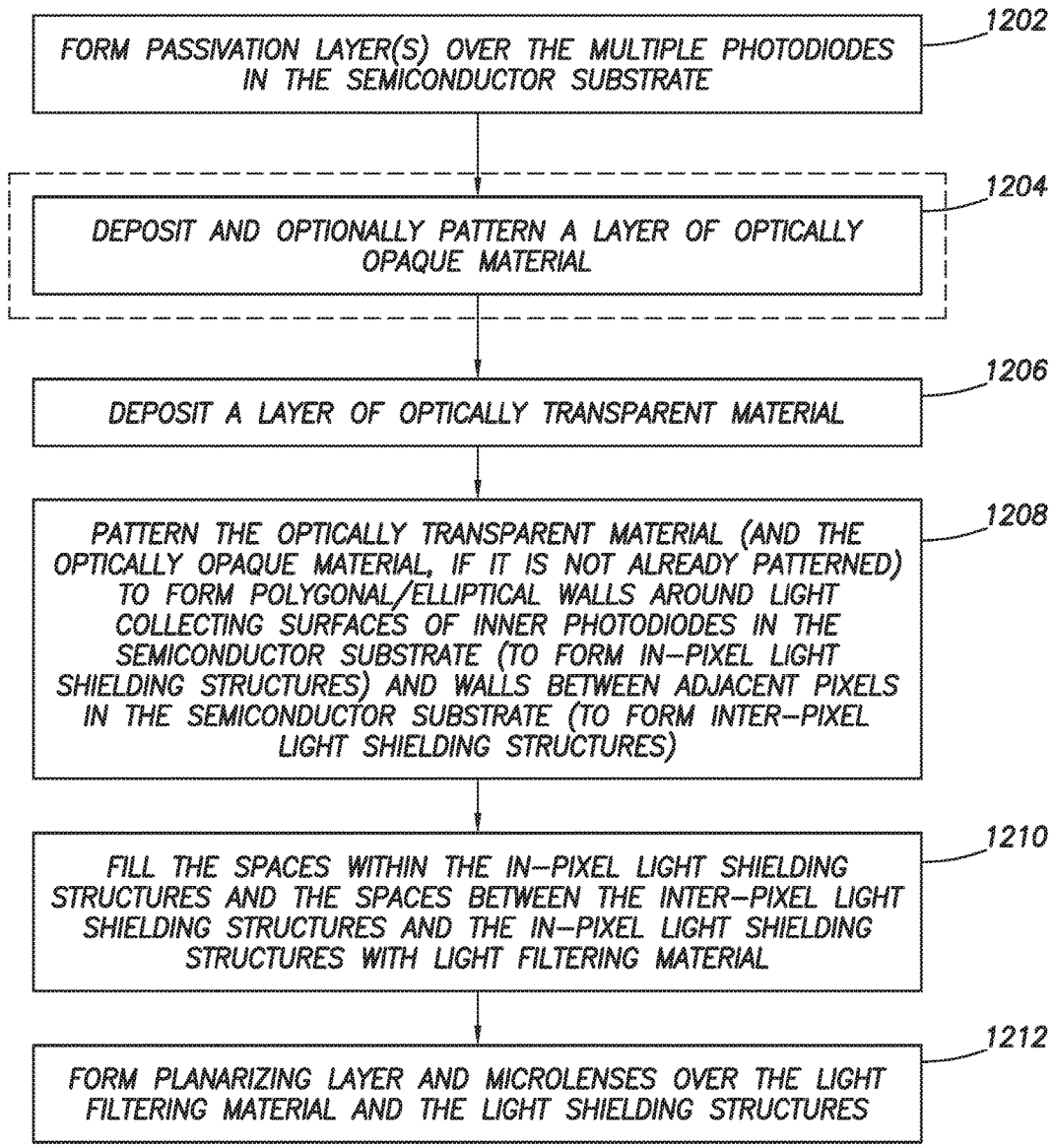
FIG. 12 is a flowchart of steps associated with the with the formation of the in-pixel light shield structure of FIG. 11D for an pixel having multiple light collecting areas, in accordance with an embodiment.

FIG. 12 is a flowchart of steps associated with the formation of a pixel with an in-pixel light shield structure filled with color filter material, in accordance with an embodiment. In step 1202, one or more passivation layers (not illustrated in FIG. 11A) may be formed over the multiple photodiodes 1001 and 1003 in the semiconductor substrate.

In step 1204, which is optional and may be omitted without deviating from the scope of the presently described embodiments, an layer of optically opaque material such as layer 1020 of FIG. 11B may be deposited and optionally patterned. In other words, over the passivation layers formed on surface 1010 in step 1202, a layer of optically opaque material (such as a metal layer) may be deposited. In some embodiments, this optically opaque material layer may be immediately patterned after deposition. In other embodiments, the patterning of the optically opaque material layer may be performed in conjunction with the pattern of other, subsequently deposited, layers. The optically opaque material layer 1020 may be deposited to a height H1 and then either immediately patterned or patterned later in conjunction with additional layers formed over the layer 1020. In the event that a pixel is fabricated with optical isolation structures that are formed using only an optically transparent material, step 1204 may be omitted. In the context of FIG. 11B, the deposition of optically opaque material layer 1020 may be omitted.

In step 1206, an optically transparent material such as silicon oxide may be deposited. In embodiments where step 1204 was performed, the optically transparent material layer may be deposited over the layer (which is optionally already patterned) of optically opaque material such as the layer 1020. Alternatively, when step 1204 is omitted, the optically transparent material layer may be deposited directly over the passivation layers formed in step 1202. The optically transparent material layer 1022 may be deposited to a height H2. In embodiments where the optically transparent material layer 1022 is the only layer deposited over the passivation layers of step 1202 (i.e., when step 1204 is omitted), then the total height H3 of the deposited layers in FIG. 11B may be the same as H2. In embodiments where both the optically transparent material layer 1022 and the optically opaque material layer 1020 are formed, the total height H3 of the deposited layers in FIG. 11B may be the sum of the height of the optically opaque material layer 1020 (i.e., height H1) and the height of the optically transparent material layer 1022 (i.e., height H2).

In step 1208, the optically transparent material layer 1022 may be patterned. If not already patterned in step 1204, the optically opaque material layer 1020 may also be patterned in this step. Patterning the layers 1022 and 1020 may refer to the deposition of photoresist material over portions of the layer 1022 and, using a photolithography mask or any other suitable technique, treating a portion of the photoresist material in a manner such that portions of the photoresist material are selectively exposed. Portions of the photoresist material that are not exposed may then be etched away, along with any portions of the layers 1022 and 1020 underlying the unexposed portions of the photoresist material.

The patterning of the layers 1022 and optionally 1020 may be performed in a manner such that polygonal (i.e., triangular, rectangular, pentagonal, etc.) or elliptical walls are formed around light collecting surfaces of photodiodes associated with an inner sub-pixel in a given toroid pixel (said photodiodes sometimes referred to as "inner photodiodes," such as inner photodiode 1001). An example of a polygonal wall of this sort is shown in FIG. 10 in connection with the rectangular or square intra-pixel isolation structure 1040. However, this is merely illustrative. Any polygonal shape may be used to form the outline of the wall surrounding an inner photodiode such as photodiode 1001. Alternatively, an elliptical shape (such as a circular shape) may be used to form the outline of the wall surrounding an inner photodiode such as photodiode 1001.

Additionally, the patterning of layers 1022 and optionally 1020 may be performed in a manner such that walls are formed between adjacent pixels to form inter-pixel isolation structures 1060. As shown in FIG. 11C, the inter-pixel isolation structures 1060 may have a width 1054 per unit cell of a single pixel, but as discussed in connection with FIG. 10, may have an actual width of 1052 when viewed in its entirety. FIG. 11C also shows the wall thickness 1056 of the intra-pixel isolation structure as also illustrated in FIG. 10.

In step 1208, the isolation fins 1042 that anchor the walls of the intra-pixel isolation structures 1040 to the inter-pixel isolation structures 1060 may be patterned/formed as well.

In step 1210, the spaces within the in-pixel light shielding structures (i.e., the space within the walls of the intra-pixel isolation structure 1040) may be filled with light filtering material. This light filtering material may be red, green, blue, cyan, yellow, magenta, near-infrared, infrared, or even clear filter material. Generally, any filter material (including bandpass and band-stop filters) for light can be used to fill the space within the intra-pixel isolation structures 1040. FIG. 11D shows light filtering material 1102 formed within the walls of the intra-pixel isolation structure 1040.

In step 1210, the spaces between the walls of the intra-pixel isolation structure 1040 (along with isolation fins 1042) and the inter-pixel isolation structure 1060 may also be filled with color filter material. In some embodiments, this may be the same filter material used to fill in the space within the intra-pixel isolation structures 1040 (i.e., filter material 1102). However, in other embodiments, the filter material formed between the walls of the intra-pixel isolation structure 1040 (along with isolation fins 1042) and the inter-pixel isolation structure 1060 may be a different filter material than the filter material 1102. FIG. 11D shows light filtering material 1104 formed between the walls of the intra-pixel isolation structure 1040 (along with isolation fins 1042) and the inter-pixel isolation structure 1060. The filter material 1102/1104 may be formed to a height H4. The height H4 may be less than, greater than, or equal to the height H3 of the intra-pixel isolation structures 1040.

In step 1212, a planarizing layer such as the layer 1110 may be formed over the light filtering material 1102/1104 and the light shielding structures 1040/1060. Finally, one or more microlenses may be formed over the planarizing layer 1110. In FIG. 11D, a single toroidal microlens 1120 is shown as being formed over the planarizing layer 1110. However, any of the microlens configurations described above may be formed in step 1212 without departing from the scope of the present embodiments.

As shown in FIG. 11D, high angle light 1190 may be incident on an upper portion of the intra-pixel isolation structure 1040 formed from the optically transparent layer 1022 material. Because the high angle light 1190 first passes through the color filter 1104, which may have a different index of refraction from the optically transparent layer 1022 material, and preferably, a much larger index of refraction from the optically transparent layer 1022 material, the high angle light 1190 may be reflected back into the outer right sub-pixel 1004-2, from which it "originated" (i.e., the sub-pixel whose associated filter the high angle light 1190 originally passed through). The reflection of high angle light 1190 back into the outer right sub-pixel 1004-2 may be due to the high angle light being incident on the intra-pixel isolation structure 1040 at an angle that falls within the range of angles of incident light that would be reflected due to total internal reflection at an interface of two materials with differing indices of refraction. Similarly, high angle light 1194 incident on the portion of the inter-pixel isolation structure 1060 that is formed from the optically transparent layer 1022 material may be reflected back into outer right sub-pixel 1004-2.

High angle light 1192 may be incident on a lower portion of the intra-pixel isolation structure 1040 formed from the optically opaque layer 1020 material (in embodiments when the optically opaque layer 1020 is deposited at all). Optically opaque layer 1020 material may be reflective or absorptive material—accordingly, high angle light 1192 incident on the optically opaque layer 1020 material used to form the intra-pixel isolation structure 1040 may be either reflected back into the outer right sub-pixel from which it "origi- nated" (i.e., the sub-pixel whose associated filter the high angle light 1192 originally passed through) or absorbed. Similarly, high angle light 1196 incident on the portion of the inter-pixel isolation structure 1060 that is formed from the optically opaque layer 1020 material may be reflected back into outer right sub-pixel 1004-2 or absorbed.

Figure 13:
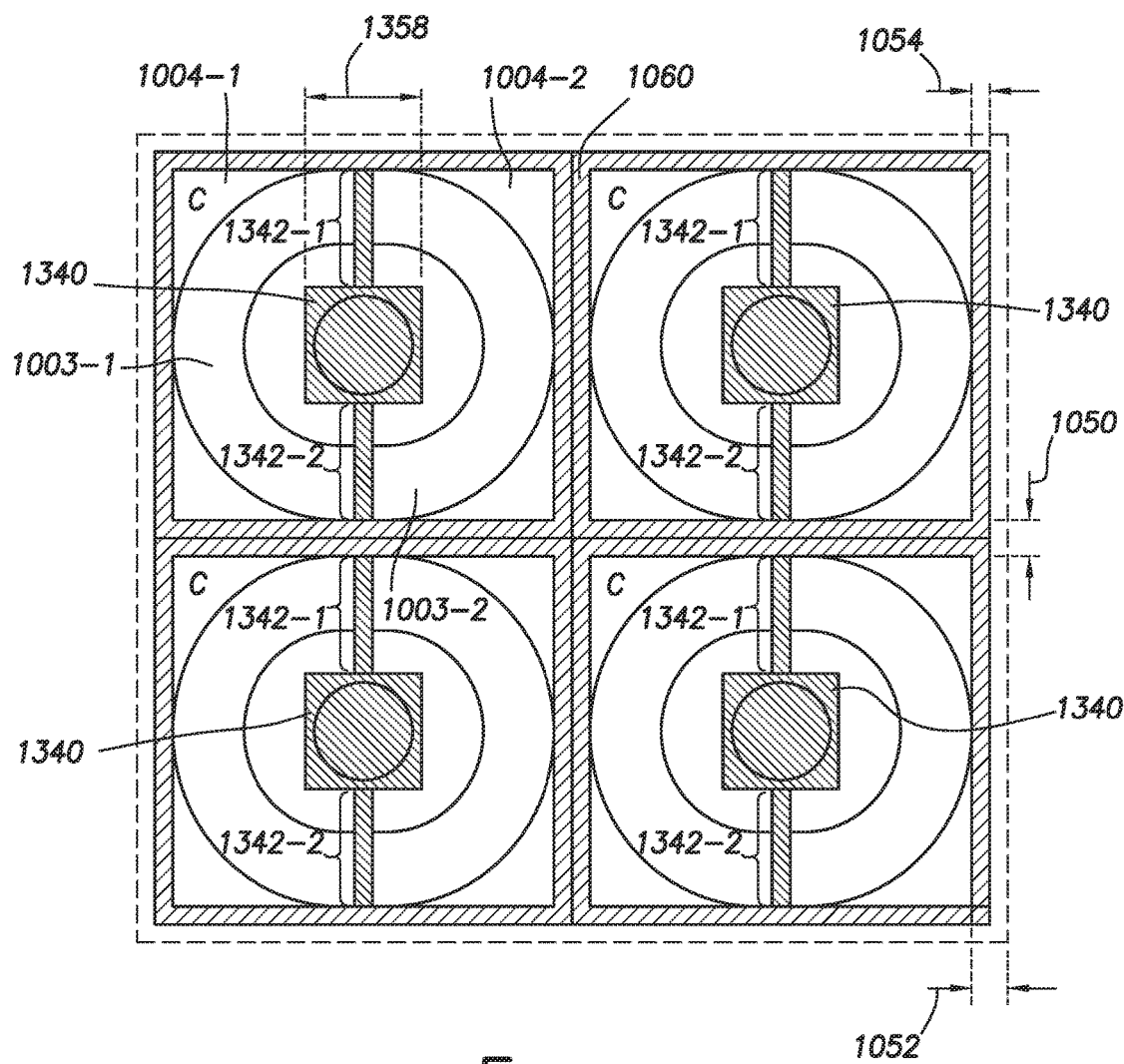
FIG. 13 is a surface view of a monochrome pattern unit cell grid of two rows and two columns of nested sub-pixels provided with in-pixel light shield structures, in accordance with an embodiment.

FIG. 13 is a surface view of a monochrome image sensor unit cell grid having two rows and two columns of nested sub-pixels provided with a solid in-pixel light shield structure grid, in accordance with an embodiment. A monochrome image sensor may include an array of pixels over which only clear color filters are formed. Nested sub-pixels 1002 (not labeled in FIG. 13, as it is covered by the structure 1340) and 1004 (labeled only in connection with the top-left clear pixel for simplicity) may be nested sub-pixels having any surface boundary geometry. As an example, the nested sub-pixels 1002 and 1004 may have polygonal or elliptical surface boundaries. For illustrative purposes of the preferred embodiment, the outer sub-pixels 1004 are shown as having a rectangular boundary, as are the inner sub-pixels 1002. The nested sub-pixels labeled with C correspond to pixels that have a clear color filter formed over them. Formed between, and separating adjacent nested sub-pixels or toroid pixels are inter-pixel optical isolation structures 1060. The shaded portion of the inter-pixel isolation structures 1060 may represent the portion of the inter-pixel isolation structures 1060 that are formed over a single unit cell grid of four pixels, and may extend to the width 1050 (when the array of pixels 22 is viewed as a whole and neighboring unit cell grids are considered). However, when considering only the view of a single unit cell (and not considering portions of the inter-pixel isolation structures 1060 that extend into neighboring pixels), the width of the inter-pixel isolation structures 1060 may be the width 1054 around the border of the unit cell. The width 1052 illustrated between the rows of adjacent pixels in the unit cell grid may be substantially equivalent to the width 1050 illustrated between columns of adjacent pixels. However, in some embodiments, the widths 1050 and 1052 of the inter-pixel isolation structures 1060 between rows and columns respectively, may be different.

The inter-pixel optical isolation structures 1060 may be used to form a grid separating the toroid pixels or nested sub-pixels from one another. Inter-pixel optical isolation structures 1060 may be formed using either an optically transparent dielectric material (such as silicon oxide, or more simply, oxide), an optically opaque material (such as metal), or a hybrid of optically transparent dielectric material and optically opaque material. The formation and structure of the hybrid inter-pixel optical isolation structures are described above in greater detail in FIGS. 11A-11D and will also be described in connection with FIGS. 14A-14D. The inter-pixel optical isolation structures 1060 may be formed over the semiconductor substrate in which the nested sub-pixels 1002 and 1004 (or nested sub-pixels as shown in FIG. 2) are formed.

Generally, the inter-pixel optical isolation structures 1060 may serve to prevent high-angle light caused by undesired glare or lens flares that is incident upon a given pixel to impact (and thereby generate charge in) an adjacent pixel. When the inter-pixel optical isolation structures 1060 (or portions thereof) are formed of optically transparent dielectric material, it may be desirable for the material to have an index of refraction that is different than the index of refraction associated with color filter material formed adjacent to the inter-pixel optical isolation structures 1060 (shown in greater detail in FIG. 14D). High angle light incident upon a given pixel may first pass through the color filter associated with the pixel before reaching the inter-pixel optical isolation structure 1060 associated with the given pixel. When the inter-pixel optical isolation structure 1060 is optically transparent, it is desirable for the material used to form the structure 1060 to have a lower index of refraction than the color filter material that light incident upon the pixel passes through. When the inter-pixel optical isolation structures 1060 has a lower index of refraction in this manner, light incident upon the inter-pixel optical isolation structures 1060 within a certain range of angles will be reflected back into the pixel whose color filter it originally passed through due to the total internal reflection of light in the color filter material that is adjacent and abutted to the inter-pixel optical isolation structures 1060.

FIG. 13 also illustrates intra-pixel optical isolation structure 1340. Intra-pixel optical isolation structure 1340 may be formed around and over the light collecting area associated with one or more inner sub-pixels (namely, the inner sub-pixel group) of nested sub-pixels. Unlike the intra-pixel optical isolation structures 1040 of FIG. 10 which are walls formed at the periphery (or, around the perimeter) of the inner sub-pixel but do not themselves overlap the inner photodiode 1001, the structures 1340 may completely cover the light collecting area of the photosensitive region (i.e., the photodiode) in the inner sub-pixel 1002 (not labeled in FIG. 13, as it is covered by the structure 1340). Intra-pixel optical isolation structures 1340 may completely surround and cover the light collecting area associated with the inner sub-pixel group of a toroid pixel. In embodiments where a toroid pixel has a single sub-pixel forming the inner sub-pixel group of the toroid pixel, the intra-pixel optical isolation structures 1340 may have a boundary at the perimeter of the single inner sub-pixel over the surface of the semiconductor substrate such that the structures 1340 completely surround (as well as cover) the single sub-pixel.

Intra-pixel optical isolation structures 1340 may be used only when an inner sub-pixel of the nested sub-pixels or toroid pixel is used to collect a broad-spectrum of light (i.e., all visible light). In some embodiments, intra-pixel isolation structures 1340 may be used when an inner sub-pixel of the nested sub-pixels or toroid pixel is used to collect infra-red (IR) or near infra-red (NIR) light. In embodiments where intra-pixel optical structures 1340 are used (as opposed to the structures 1040 of FIG. 10), only optically transparent material may be used to form the structures 1340, whereas in the structures 1040 of FIG. 10 may be formed from a hybrid of optically transparent (such as layer 1022) and optically opaque (such as layer 1020) materials could be used. Intra-pixel optical structures 1340 may necessarily need to be formed from optically transparent material, as the structures 1340 overlap with and are formed over the photodiode in the inner sub-pixel and would prevent light from being received at the photodiode if an optically opaque material was used. However, the intra-pixel optical isolation structures 1340 may be non-overlapping with the photosensitive regions 1003-1 and 1003-2 of the outer left and outer right sub-pixels 1004-1 and 1004-2, respectively.

Intra-pixel optical isolation structures 1340 may be anchored or structurally coupled to the inter-pixel optical isolation structures 1060 by isolation fins 1342-1 and 1342-2. Isolation fins 1342, like the inter-pixel optical isolation structures 1060, may be formed using either an optically transparent dielectric material (such as silicon oxide, or more simply, oxide), an optically opaque material (such as metal), or a hybrid of optically transparent dielectric material and optically opaque material. The isolation fins 1342 and the intra-pixel optical isolation structures may be formed in the same manner and using the same processing steps (including concurrent/common process steps) as the inter-pixel optical isolation structures 1060. Both the isolation fins 1342 and the intra-pixel optical isolation structures 1340 may be formed over an isolation region such as the isolation regions 408 and 508 of FIGS. 4 and 5 (with the intra-pixel optical isolation structures 1340 extending beyond the isolation regions and onto/over the photodiode in the inner sub-pixel). Generally, the isolation fins 1342 may be formed over any region of the semiconductor substrate of a pixel that does not serve as a light-collecting surface/area of a photodiode in any of the sub-pixels of the pixel (i.e., nested sub-pixels or toroid pixels).

As described above in connection with the inter-pixel optical isolation structures 1060, the intra-pixel optical isolation structures 1340, in combination with the isolation fins 1042, may serve to prevent high-angle light caused by undesired glare or lens flares that is incident upon a given sub-pixel to impact (and thereby generate charge in) an adjacent sub-pixel. The intra-pixel optical isolation structures 1340 may prevent high angle light incident on one of the outer sub-pixels (such as the outer left sub-pixel 1004-1 or the outer right sub-pixel 1004-2) from impeding on (and generating charge in) the light collecting area of the photodiode in the inner sub-pixel (such as the photodiode 1001 in the inner sub-pixel 1002). Similarly, intra-pixel optical isolation structures 1340 may prevent high angle light incident on the inner sub-pixel (such as inner sub-pixel 1002) from impeding on (and generating charge in) the light collecting area of the photodiodes in the outer sub-pixels (such as the photodiode 1003-1 in outer left sub-pixel 1004-1 or the photodiode 1003-2 in outer right sub-pixel 1004-2).

When the intra-pixel optical isolation structures 1340 and the isolation fins 1342 (or portions of the isolation fins) are formed of optically transparent dielectric material, it may be desirable for the material to have an index of refraction that is different than the index of refraction associated with color filter material formed adjacent to the intra-pixel optical isolation structures 1340 and the isolation fins 1342. High angle light incident upon a given pixel may first pass through the color filter associated with a given one of the sub-pixels in the toroid pixel before reaching the intra-pixel optical isolation structure 1340 and/or the isolation fins 1342 associated with and adjacent to the given sub-pixel. When the intra-pixel optical isolation structure 1340 and/or the isolation fins 1342 are optically transparent, it is desirable for the material used to form the structure 1340 and/or the fins 1342 to have a lower index of refraction than the color filter material that light incident upon the given sub-pixel passes through. When the intra-pixel optical isolation structures 1340 and/or the isolation fins 1342 have a lower index of refraction in this manner, light incident upon the intra-pixel optical isolation structures 1340 and/or the fins 1342 within a certain range of angles will be reflected back into the sub-pixel whose color filter it originally passed through due to the total internal reflection of light in the color filter material that is adjacent and abutted to the intra-pixel optical isolation structures 1340 and/or the isolation fins 1342.

The intra-pixel isolation structures 1340 may have a thickness 1358. The thickness of the isolation fins 1342 may be the thickness 1056, the thickness of the walls of the intra-pixel isolation structures 1040 (of FIG. 10). Alternatively, the isolation fins 1342 may have any thickness. Isolation fins 1342 may provide structural support to the intra-pixel optical isolation structures 1340, which without the isolation fins 1342, would be untethered or unanchored to any other structure formed over the semiconductor substrate in which the sub-pixels 1002 and 1004 are formed. Furthermore, just as the intra-pixel isolation structures 1340 optically isolate the inner subpixel 1002 from the sub-pixels in the outer sub-pixel group 1004 (such as the outer left sub-pixel 1004-1 and the outer right sub-pixel 1004-2), the isolation fins 1342 serve to optically isolate the outer left sub-pixel 1004-1 and the outer right sub-pixel 1004-2 from one another.

The exterior space of the intra-pixel isolation structures 1340 adjacent to the isolation fins 1342 (i.e., the space over one or more of the outer sub-pixels 1004) may be filled with clear filter material to pass broad spectrum light (i.e., all visible light) and/or infra-red light.

Forming isolation fins 132 such that high angle light incident on one of the sub-pixels of the outer sub-pixel group 1004 (such as, for example, the outer left sub-pixel 1004-1) does not pass through to another one of the sub-pixels of the outer sub-pixel group 1004 (such as, for example, the outer right sub-pixel 1004-2) may be advantageous when the image signals captured by the outer sub-pixels are read out separately. Moreover, such optical isolation may be advantageous for using the sub-pixels in phase detection applications when the image output of a first half-pixel (or the first half-pixels of multiple pixels) is compared to the image output of a second half-pixel (or the second half-pixels of multiple pixels) for determining whether or not focusing settings for an imager are appropriate.

Figure 14A:
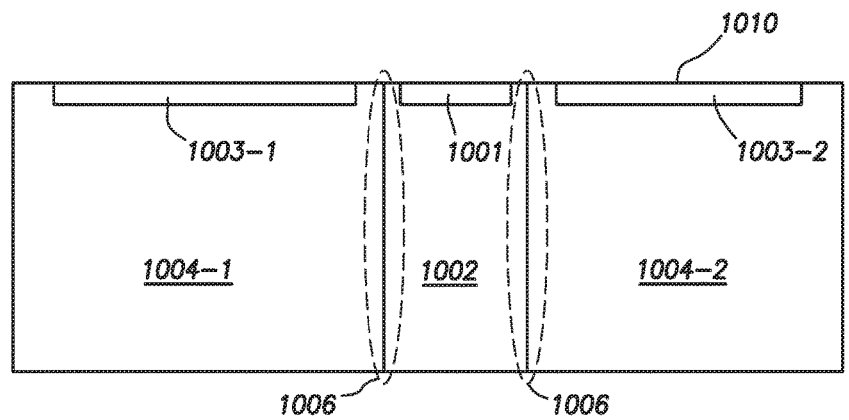
FIGS. 14A-14D illustrate processing stages associated with the formation of a in-pixel light shield structure filled with dielectric material for an pixel having multiple light collecting areas, in accordance with an embodiment.

FIGS. 14A-14D illustrate processing stages associated with the formation of a solid in-pixel light shield structure for an pixel having multiple light collecting areas, in accordance with an embodiment. FIG. 14A shows a cross-sectional side view of a color pixel such as one of the color pixels shown in FIG. 13, prior to the formation of inter-pixel and intra-pixel isolation structures, color filters, and/or lenses. The pixel shown in FIG. 14A may correspond to nested sub-pixels having an outer sub-pixel group with two sub-pixels (i.e., an outer left sub-pixel group 1004-1 and an outer right sub-pixel group 1004-2), semiconductor substrate with an upper surface 1010 on which planarization layers (not illustrated) may be formed. These planarization layers may include multiple layers of materials having progressively increasing/decreasing indices of refraction to minimize the reflectivity of the upper surface 1010. The semiconductor substrate may include two outer sub-pixels such as the outer left sub-pixel 1004-1 and the outer right sub-pixel 1004-2. Photosensitive regions (i.e., photodiodes) 1003-1 and 1003-2 may be formed in the outer left sub-pixel 1004-1 and the outer right sub-pixel 1004-2, respectively. Nested within the outer sub-pixels 1004 may be the inner sub-pixel 1002. Photosensitive region (i.e., photodiode) 1001 may be formed in the inner sub-pixel 1002.

Isolation regions 1006 may be formed between the outer sub-pixels 1004 and the inner sub-pixel 1002. Isolation regions 1006 may be similar to the isolation regions 206 described above in connection with FIG. 2B.

Figure 14B:
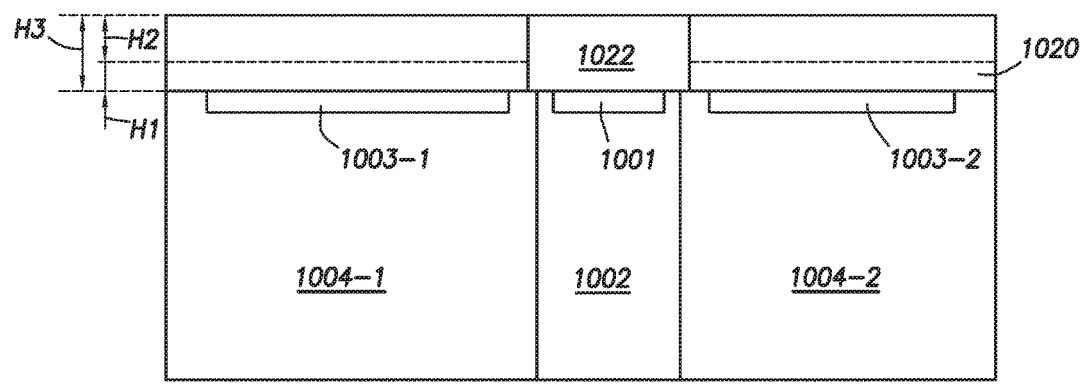
Figure 14C:
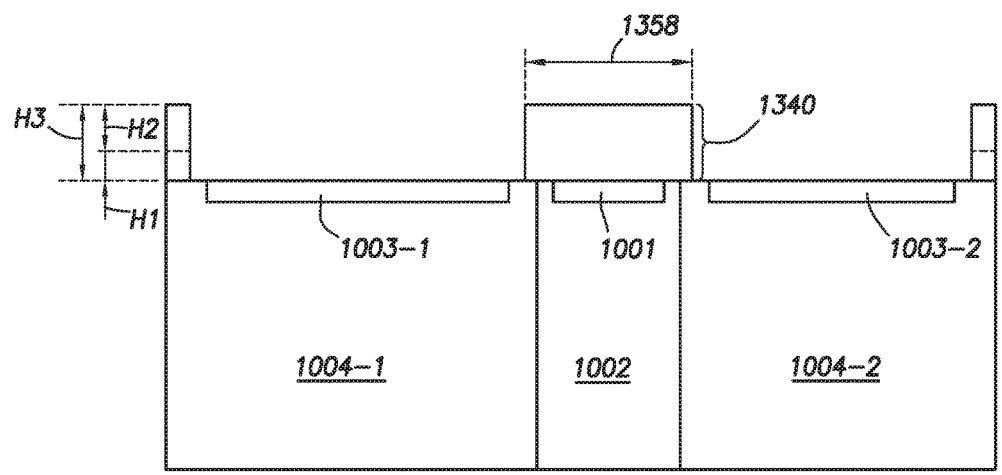
Figure 14D:
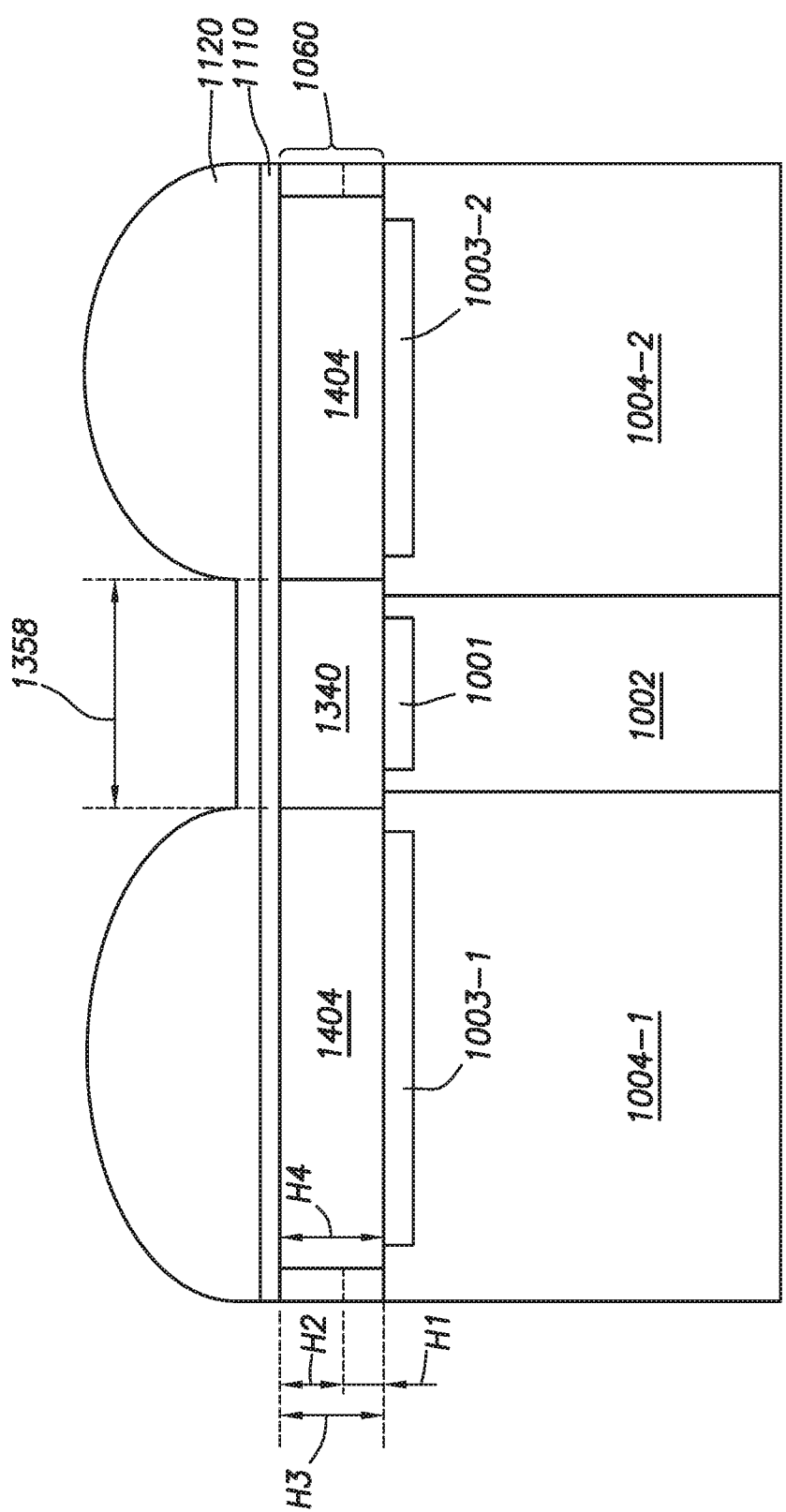
Figure 15:
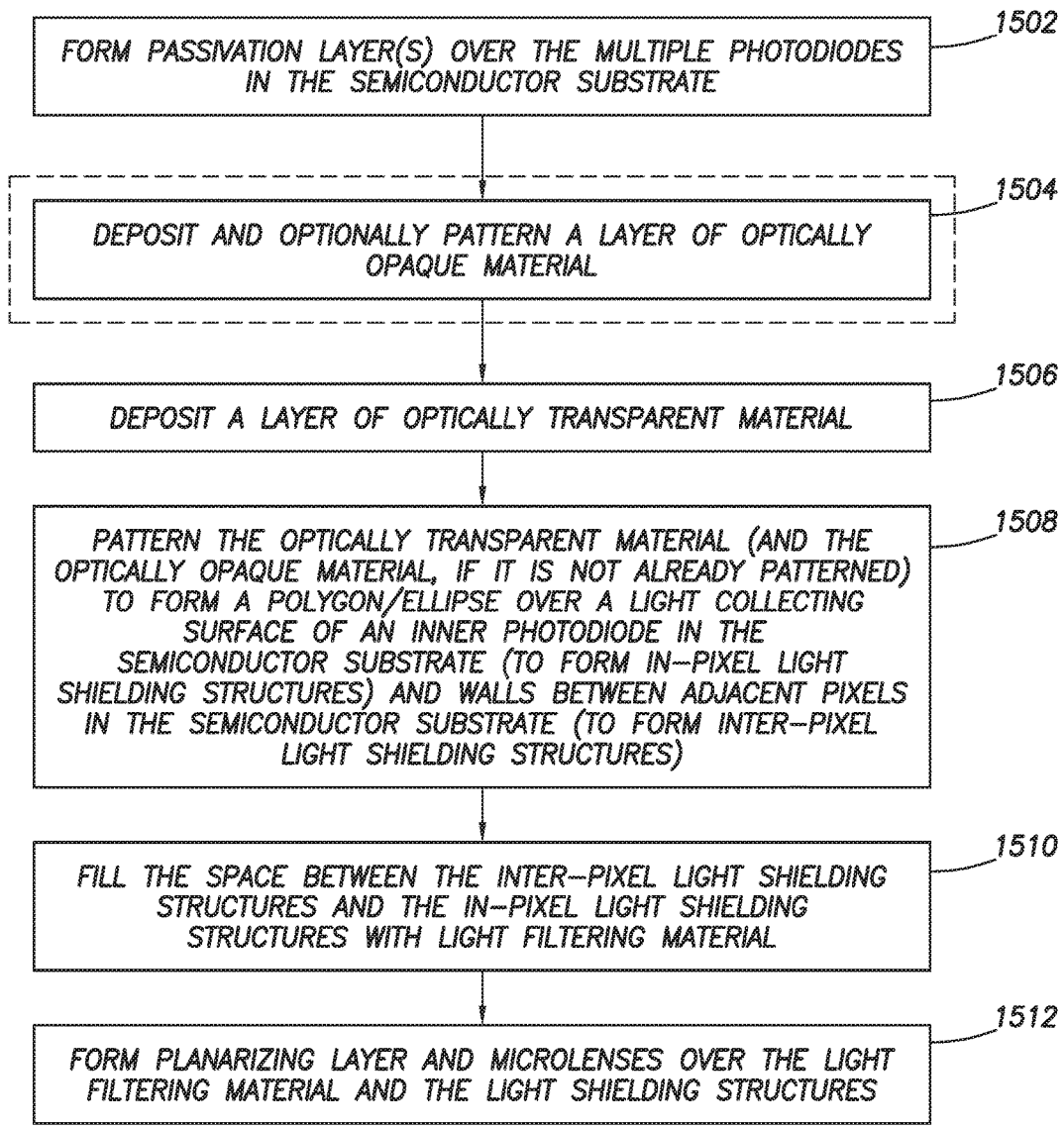
FIG. 15 is a flowchart of steps associated with the with the formation of the in-pixel light shield structure of FIG. 14D for an pixel having multiple light collecting areas, in accordance with an embodiment.

FIG. 15 is a flowchart of steps associated with the with the formation of the in-pixel light shield structure of FIG. 14D for an pixel having multiple light collecting areas, in accordance with an embodiment. In step 1502, one or more passivation layers (not illustrated in FIG. 14A) may be formed over the multiple photodiodes 1001 and 1003 in the semiconductor substrate.

In step 1504, which is optional and may be omitted without deviating from the scope of the presently described embodiments, an layer of optically opaque material such as layer 1020 of FIG. 14B may be deposited and optionally patterned. In other words, over the passivation layers formed on surface 1010 in step 1502, a layer of optically opaque material (such as a metal layer) may be deposited. In some embodiments, this optically opaque material layer may be immediately patterned after deposition. In other embodiments, the patterning of the optically opaque material layer may be performed in conjunction with the pattern of other, subsequently deposited, layers. The optically opaque material layer 1020 may be deposited to a height H1 and then either immediately patterned or patterned later in conjunction with additional layers formed over the layer 1020. In the event that a pixel is fabricated with optical isolation structures that are formed using only an optically transparent material, step 1504 may be omitted. In the context of FIG. 14B, the deposition of optically opaque material layer 1020 may be omitted.

Notably, step 1504 of FIG. 15 differs from step 1204 of FIG. 12 in that the deposition of the optically opaque layer 1020 may never involve the deposition of the layer over the inner sub-pixel 1002. Or, if layer 1020 is deposited over the inner sub-pixel, the deposited opaque material formed over the inner sub-pixel 1020 may be etched away in the patterning of the optically opaque layer 1020 prior to the deposition of an optically transparent layer 1022.

In step 1506, an optically transparent material such as silicon oxide may be deposited. In embodiments where step 1504 was performed, the optically transparent material layer 1022 may be deposited over the layer (which is optionally already patterned) of optically opaque material such as the layer 1020 (except over the inner sub-pixel 1002, where the opaque layer 1020 was either not deposited or patterned/etched away prior to the deposition of the transparent layer 1022). Alternatively, when step 1504 is omitted, the optically transparent material layer may be deposited directly over the passivation layers formed in step 1502. The optically transparent material layer 1022 may be deposited to a height H2 that may equal the height H3 in a region over the inner sub-pixel 1002 (or that may equal the height H3 in the event that step 1504 is omitted). In embodiments where the optically transparent material layer 1022 is the only layer deposited over the passivation layers of step 1202 (i.e., when step 1504 is omitted), then the total height H3 of the deposited layers in FIG. 11B may be the same as H2. In embodiments where both the optically transparent material layer 1022 and the optically opaque material layer 1020 are formed, the total height H3 of the deposited layers in FIG. 11B may be the sum of the height of the optically opaque material layer 1020 (i.e., height H1) and the height of the optically transparent material layer 1022 (i.e., height H2) in regions other than the area over the inner sub-pixel 1002, where only the optically transparent material layer is deposited (to a height H3).

In step 1508, the optically transparent material layer 1022 may be patterned. If not already patterned in step 1504, the optically opaque material layer 1020 may also be patterned in this step. Patterning the layers 1022 and 1020 may refer to the deposition of photoresist material over portions of the layer 1022 and, using a photolithography mask or any other suitable technique, treating a portion of the photoresist material in a manner such that portions of the photoresist material are selectively exposed. Portions of the photoresist material that are not exposed may then be etched away, along with any portions of the layers 1022 and 1020 underlying the unexposed portions of the photoresist material.

The patterning of the layers 1022 and optionally 1020 may be performed in a manner such that polygonal solids (i.e., a geometric prism shape, or triangular, rectangular, pentagonal, etc. solids) or elliptical solids (i.e., cylinders)

are formed around light collecting surfaces of photodiodes associated with an inner sub-pixel in a given toroid pixel (said photodiodes sometimes referred to as "inner photodiodes," such as inner photodiode 1001). An example of a polygonal wall of this sort is shown in FIG. 10 in connection with the rectangular or square intra-pixel isolation structure 1040. However, this is merely illustrative. Any polygonal shape may be used to form the base of the prism of the optically transparent material layer 1022) formed on and over an inner photodiode such as photodiode 1001 to form the intra-pixel isolation structure 1340. Alternatively, an elliptical cylinder (such as a circular cylinder) of the optically transparent material layer 1022 may be used to form the outline of the wall surrounding an inner photodiode such as photodiode 1001 to form the intra-pixel isolation structure 1340.

Additionally, the patterning of layers 1022 and optionally 1020 may be performed in a manner such that walls are formed between adjacent pixels to form inter-pixel isolation structures 1060. As shown in FIG. 14C, the inter-pixel isolation structures 1060 may have a width 1054 per unit cell of a single pixel, but as discussed in connection with FIGS. 10 and 13, may have an actual width of 1052 when viewed in its entirety. FIG. 14C also shows the thickness 1358 of the intra-pixel isolation structure 1340 as also illustrated in FIG. 13.

In step 1508, the isolation fins 1342 that anchor the walls of the intra-pixel isolation structures 1340 to the inter-pixel isolation structures 1060 may be patterned/formed as well.

In step 1510, the spaces between the outer edge of the intra-pixel isolation structure 1340 (along with isolation fins 1342) and the inter-pixel isolation structure 1060 may also be filled with clear color filter material to create a monochrome sensor. FIG. 14D shows light filtering material 1404 formed between the walls of the intra-pixel isolation structure 1340 (along with isolation fins 1342) and the inter-pixel isolation structure 1060. The filter material 1404 may be formed to a height H4. The height H4 may be less than, greater than, or equal to the height H3 of the intra-pixel isolation structures 1340.

In step 1512, a planarizing layer such as the layer 1110 may be formed over the light filtering material 1404 and the light shielding structures 1340/1060. Finally, one or more microlenses may be formed over the planarizing layer 1110. In FIG. 14D, a single toroidal microlens 1120 is shown as being formed over the planarizing layer 1110. However, any of the microlens configurations described above may be formed in step 1512 without departing from the scope of the present embodiments.

Figure 16:
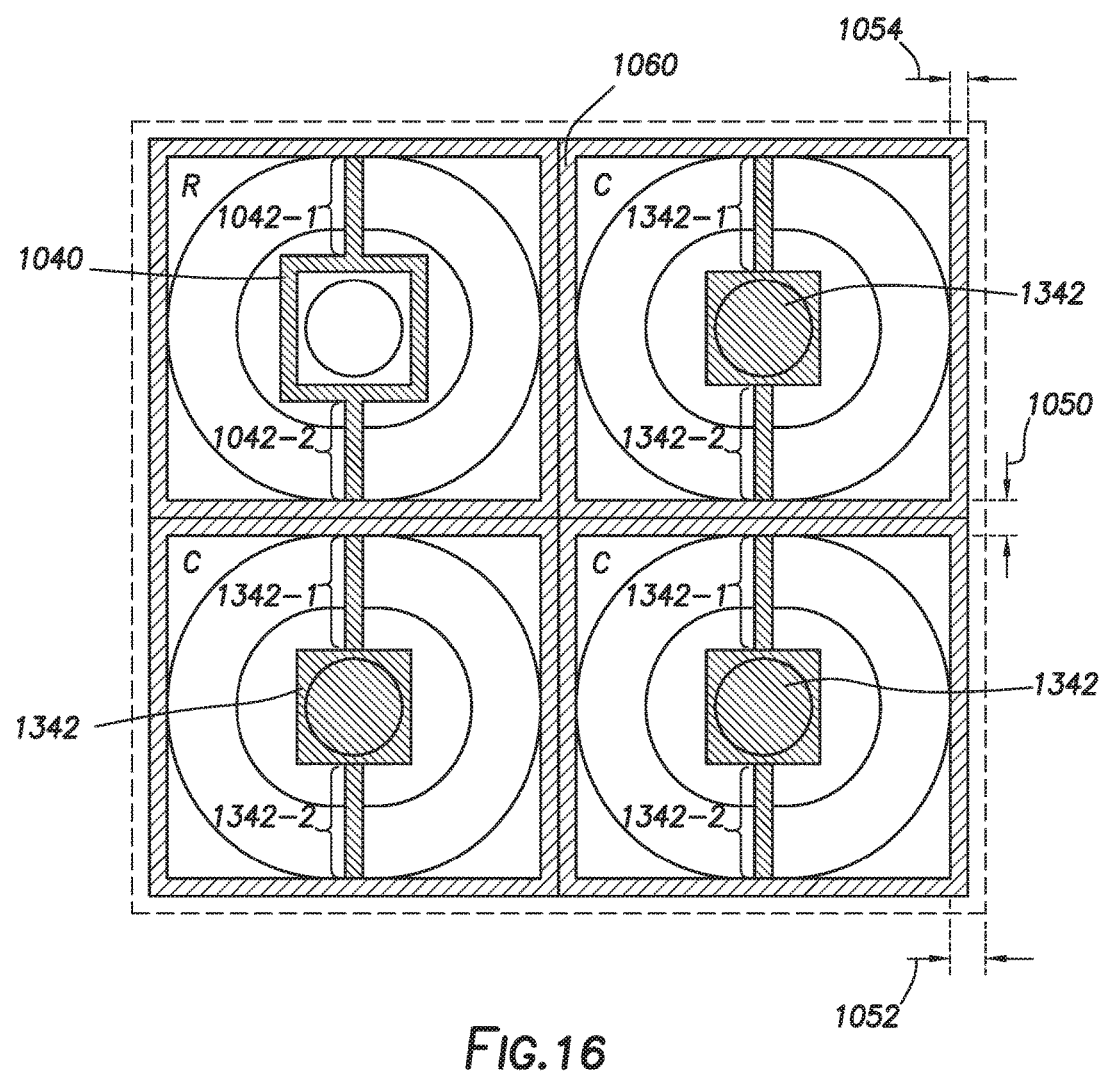
FIG. 16 is a surface view of a hybrid color-monochrome pattern unit cell grid of two rows and two columns of nested sub-pixels provided with in-pixel light shield structures, in accordance with an embodiment.

FIG. 16 is a surface view of a hybrid color-monochrome image sensor unit cell grid having two rows and two columns of nested sub-pixels provided with both solid and color filter-filled in-pixel light shield structures, in accordance with an embodiment. The pixel labeled as R may be formed according to the flowchart of steps set forth in FIG. 12 to create a pixel as shown in FIG. 11D, whereas the pixels labeled as C may be formed according to the flowchart of steps set forth in FIG. 15 to create a pixel as shown in FIG. 14D. Generally, a pixel array may have any combination of pixels with color filter-filled in-pixel light shield structures such as the structures shown in FIG. 11D and pixels with solid in-pixel light shield structures such as the structures shown in FIG. 14D. Generally, the pixels provided with solid in-pixel light shield structures as shown in FIG. 14D may be clear pixels. However, in certain embodiments, pixels provided with filter-filled in-pixel light shield structures as shown in FIG. 11D may be used as clear pixels (by using clear filter material for the material 1102 and 1104, in connection with the reference numerals used in FIG. 11D).

Certain examples of two pixel by two pixel unit cells that may be used in an image pixel array may be Red-Clear/Clear-Green, Red-Clear/Clear-Blue, Red-Clear/Clear-Clear (as shown in FIG. 16), and Red-Green/Blue-Clear, where the first two colors relate to the first two pixels in a first row of an exemplary unit cell, and the second two colors relate to the second two pixels in a second row of an exemplary unit cell.

The light collecting area of the one or more sub-pixel groups that surround an inner sub-pixel in nested sub-pixels may have a higher sensitivity to light than the inner sub-pixel. In other words, in response to incident light, more charges will be generated in the one or more sub-pixel groups surrounding the inner sub-pixel than are generated in the inner sub-pixel. The differing sensitivities of the light collecting areas of the inner sub-pixel and the one or more outer sub-pixel groups that laterally surround the inner sub-pixel may enable a pixel using nested sub-pixels to have a high dynamic range response to incident light. In bright light conditions, the inner sub-pixel, which may contain a number of charges that are diffused or leaked from the one or more outer sub-pixel groups that surround the inner sub-pixel, may provide a non-saturated image signal that can be used in to produce an accurate image despite the bright light conditions. In low light conditions, the outer sub-pixel groups with more sensitive light collecting areas will generate sufficient charges to accurately image the low light conditions. In this way, nested sub-pixels may be used in high dynamic range imaging systems to produce accurate images in a variety of lighting conditions; nested sub-pixels may also be used to remove or reduce motion artifacts, flickering, and other undesirable image aberrations or deficiencies, that are present and to a degree inherent in conventional multi-exposure image sensors.

The inner sub-pixel and one or more outer sub-pixel groups in a nested image pixel may have the same geometric optical centers. In other words, because the one or more outer sub-pixel groups surround the inner sub-pixel symmetrically, the center of the surface of the inner sub-pixel group is the same as the center of the respective surfaces of each of the one or more outer sub-pixel groups that surround the inner sub-pixel. The one or more outer sub-pixel groups that surround the inner sub-pixel may have greater respective light sensitivities than the light sensitivity of the inner sub-pixel. As an example, for a given amount of light over a nested sub-pixel pixel, more photogenerated charges will be produced in the one or more outer sub-pixel groups than will be produced in the inner sub-pixel of the nested sub-pixels. The ratio of the light sensitivity of the one or more outer sub-pixel groups to the light sensitivity of the inner sub-pixel of a nested sub-pixel pixel may be at least 4 to 1, but could be 10 to 1, 20 to 1, any intermediate ratio, or any larger ratio. In other words, the light sensitivity of the one or more outer sub-pixel groups may be at least four times greater than the light sensitivity of the inner sub-pixel. Light sensitivity may refer to the amount of light collected by a given sub-pixel or sub-pixel group, and may be determined by the light collecting area of a sub-pixel or sub-pixel group, amount and shape of microlenses formed over a sub-pixel or sub-pixel group, type of color filter formed over a sub-pixel or sub-pixel group, or other attributes of a sub-pixel or sub-pixel group.

As described above, in various embodiments, intra-pixel isolation structures may be formed in conjunction with inter-pixel isolation structures. These intra-pixel isolation structures may, in embodiments where a multi-photodiode image pixel is used for monochrome imaging, overlap the light collecting area of an inner sub-pixel of the multi-photodiode image pixel. In embodiments where the multi-photodiode image pixel is used for color or near-infrared (NIR) imaging, the intra-pixel isolation structures may simply surround the light collecting area of the inner sub-pixel and be filled with a light filtering material. Isolation fins may be used to anchor the and structurally couple the intra-pixel isolation structures to inter-pixel isolation structures formed between adjacent multi-photodiode image pixels.

In some embodiments, the intra-pixel isolation structures may have at least a portion formed from an optically transparent material. This optically transparent material may have an index of refraction that is different from the light filtering material formed over certain sub-pixels in the multi-photodiode image pixel. In certain embodiments, only a portion of the intra-pixel isolation structure may be formed from an optically transparent material, with the remainder being formed from an optically opaque material.

The foregoing is merely illustrative of the principles of this invention which can be practiced in other embodiments.

What is claimed is:

1. An image pixel, comprising:
   an outer sub-pixel group that includes at least a first sub-pixel, wherein the first sub-pixel has a first light sensitivity;
   an inner sub-pixel group that is nested within the outer sub-pixel group and that includes at least a second sub-pixel, wherein the second sub-pixel has a second light sensitivity that is less than the first light sensitivity;
   a light filter layer formed over at least the outer sub-pixel group;
   an inter-pixel light shielding structure that is formed at an outer boundary of the image pixel; and
   an intra-pixel light shielding structure that is formed over an outer perimeter of the inner sub-pixel group, wherein the light filter layer, the inter-pixel light shielding structure, and the intra-pixel light shielding structure are coplanar.

2. The image pixel of claim 1, wherein the light filter layer is formed only between the inter-pixel light shielding structure and the intra-pixel light shielding structure.

3. The image pixel of claim 2, wherein the intra-pixel light shielding structure completely covers the second sub-pixel.

4. The image pixel of claim 3, wherein the light filter layer is a clear filter.

5. The image pixel of claim 1, wherein the light filter layer has a first portion formed over the inner sub-pixel group and a second portion formed over the outer sub-pixel group, wherein the intra-pixel light shielding structure extends in a ring around the first portion, wherein the inter-pixel light shielding structure extends in a ring around the second portion, and wherein the second portion is interposed between the intra-pixel light shielding structure and the inter-pixel light shielding structure.

6. The image pixel of claim 5, wherein the light filter layer is a color filter.

7. The image pixel of claim 5, wherein the light filter layer is a color filter and wherein the first and second portions both transmit the same color of light.

8. The image pixel of claim 1, wherein the intra-pixel light shielding structure has an optically transparent portion having a first index of refraction and wherein the light filter layer has a second index of refraction that is different from the first index of refraction.

9. The image pixel of claim 1, wherein the intra-pixel light shielding structure comprises:
   an optically opaque portion that is formed over the outer perimeter of the inner sub-pixel group; and
   an optically transparent portion that is formed over the optically opaque portion.

10. The image pixel of claim 1, further comprising:
    microlenses that direct incident light toward the second sub-pixel group.

11. The image pixel of claim 1, further comprising:
    a toroidal microlens that directs light toward the second sub-pixel group.

12. The image pixel of claim 1, further comprising:
    fin structures that connect the inter-pixel light shielding structure and the intra-pixel light shielding structure.

13. The image pixel of claim 1, wherein the outer sub-pixel group and the inner sub-pixel group are concentric.

14. The image pixel of claim 1, further comprising:
    a toroidal microlens that covers the outer sub-pixel group and that has an opening, wherein the opening in the toroidal microlens overlaps the inner sub-pixel group.

15. An image pixel, comprising:
    an outer sub-pixel group that includes at least a first sub-pixel, wherein the first sub-pixel has a first light sensitivity;
    an inner sub-pixel group that is nested within the outer sub-pixel group and that includes at least a second sub-pixel, wherein the second sub-pixel has a second light sensitivity that is less than the first light sensitivity;
    a light filter layer formed over at least the outer sub-pixel group;
    a toroidal microlens that covers the outer sub-pixel group and that has an opening, wherein the opening in the toroidal microlens overlaps the inner sub-pixel group;
    an inter-pixel light shielding structure that is formed at an outer boundary of the image pixel; and
    an intra-pixel light shielding structure that is formed over an outer perimeter of the inner sub-pixel group.

16. An image pixel, comprising:
    an outer sub-pixel group that includes at least a first sub-pixel that has a first light sensitivity;
    an inner sub-pixel group that includes at least a second sub-pixel that has a second light sensitivity that is less than the first light sensitivity, wherein the outer sub-pixel group and the inner sub-pixel group are concentric;
    a light filter layer formed over at least the outer sub-pixel group;
    an inter-pixel light shielding structure that is formed at an outer boundary of the image pixel; and
    an intra-pixel light shielding structure that is formed over an outer perimeter of the inner sub-pixel group.

* * * * *